(12) United States Patent
Godo et al.

(10) Patent No.: US 9,391,209 B2
(45) Date of Patent: Jul. 12, 2016

(54) SEMICONDUCTOR DEVICE

(71) Applicant: Semiconductor Energy Laboratory Co., Ltd., Atsugi-shi, Kanagawa-ken (JP)

(72) Inventors: Hiromichi Godo, Isehara (JP); Yasuyuki Arai, Atsugi (JP); Satohiro Okamoto, Fukuroi (JP); Mari Terashima, Ayase (JP); Eriko Nishida, Atsugi (JP); Junpei Sugao, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/024,962

(22) Filed: Sep. 12, 2013

(65) Prior Publication Data

US 2014/0014954 A1    Jan. 16, 2014

Related U.S. Application Data

(63) Continuation of application No. 13/018,879, filed on Feb. 1, 2011, now Pat. No. 8,546,811.

(30) Foreign Application Priority Data

Feb. 5, 2010   (JP) .................. 2010-024636

(51) Int. Cl.
  *H01L 27/14*   (2006.01)
  *H01L 29/786*   (2006.01)
  *H01L 29/417*   (2006.01)

(52) U.S. Cl.
  CPC ...... *H01L 29/7869* (2013.01); *H01L 29/41733* (2013.01); *H01L 29/78606* (2013.01)

(58) Field of Classification Search
  CPC .................. H01L 29/7869; H01L 29/41733; H01L 2/786069

USPC ................... 257/40, 43, 59, 72, 258
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| CN | 101226901 A | 7/2008 |
| EP | 1 770 788 A | 4/2007 |

(Continued)

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(Continued)

*Primary Examiner* — Tan N Tran
(74) *Attorney, Agent, or Firm* — Robinson Intellectual Property Law Office; Eric J. Robinson

(57) ABSTRACT

An object is to provide a semiconductor device including an oxide semiconductor in which miniaturization is achieved while favorable characteristics are maintained. The semiconductor includes an oxide semiconductor layer, a source electrode and a drain electrode in contact with the oxide semiconductor layer, a gate electrode overlapping with the oxide semiconductor layer, a gate insulating layer provided between the oxide semiconductor layer and the gate electrode, and an insulating layer provided in contact with the oxide semiconductor layer. A side surface of the oxide semiconductor layer is in contact with the source electrode or the drain electrode. An upper surface of the oxide semiconductor layer overlaps with the source electrode or the drain electrode with the insulating layer interposed between the oxide semiconductor layer and the source electrode or the drain electrode.

29 Claims, 12 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,262,782 B1 | 8/2007 | Parenteau et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,394 B2 | 8/2009 | Furuta et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,910,920 B2 | 3/2011 | Park et al. | |
| 7,923,287 B2 | 4/2011 | Lee et al. | |
| 7,932,521 B2 | 4/2011 | Akimoto et al. | |
| 7,981,734 B2 | 7/2011 | Furuta et al. | |
| 8,274,077 B2 | 9/2012 | Akimoto et al. | |
| 8,384,077 B2 | 2/2013 | Yano et al. | |
| 8,445,902 B2 * | 5/2013 | Sato et al. | 257/43 |
| 8,563,356 B2 | 10/2013 | Cheong et al. | |
| 8,809,857 B2 | 8/2014 | Cheong et al. | |
| 8,981,369 B2 | 3/2015 | Yano et al. | |
| 2001/0046027 A1 | 11/2001 | Tai et al. | |
| 2001/0049163 A1* | 12/2001 | Yamazaki et al. | 438/158 |
| 2002/0056838 A1 | 5/2002 | Ogawa | |
| 2002/0132454 A1 | 9/2002 | Ohtsu et al. | |
| 2002/0197760 A1* | 12/2002 | Yamazaki et al. | 438/48 |
| 2003/0189401 A1 | 10/2003 | Kido et al. | |
| 2003/0218222 A1 | 11/2003 | Wager et al. | |
| 2004/0000693 A1* | 1/2004 | Chung | H01L 21/28525 257/377 |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0126058 A1* | 6/2007 | Godo et al. | 257/344 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197350 A1 | 8/2008 | Park et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134939 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0186445 A1* | 7/2009 | Akimoto | 438/104 |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0022055 A1* | 1/2010 | Bae et al. | 438/158 |
| 2010/0051935 A1* | 3/2010 | Lee et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0141100 A1 | 6/2011 | Park et al. | |
| 2011/0147735 A1 | 6/2011 | Cheong | |
| 2011/0163311 A1 | 7/2011 | Akimoto et al. | |
| 2011/0193080 A1 | 8/2011 | Yamazaki et al. | |
| 2012/0074407 A1 | 3/2012 | Yamazaki et al. | |

FOREIGN PATENT DOCUMENTS

| | | |
|---|---|---|
| EP | 1933385 A | 6/2008 |
| JP | 60-198861 A | 10/1985 |
| JP | 63-210022 A | 8/1988 |
| JP | 63-210024 A | 8/1988 |
| JP | 63-210025 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-077486 A | 3/1994 |
| JP | 06-326314 A | 11/1994 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |

(56) References Cited

FOREIGN PATENT DOCUMENTS

| JP | 2008-535205 | | 8/2006 |
|---|---|---|---|
| JP | 1 737 044 | A | 12/2006 |
| JP | 2007-123861 | A | 5/2007 |
| JP | 2008-205469 | A | 9/2008 |
| JP | 1 995 787 | A | 11/2008 |
| JP | 1 998 373 | A | 12/2008 |
| JP | 1 998 374 | A | 12/2008 |
| JP | 1 998 375 | A | 12/2008 |
| JP | 2009-253204 | A | 10/2009 |
| JP | 2009-272427 | A | 11/2009 |
| JP | 2010-123913 | A | 6/2010 |
| JP | 2 226 847 | A | 9/2010 |
| JP | 2011-124532 | A | 6/2011 |
| JP | 2011-129865 | A | 6/2011 |
| WO | WO 2004/114391 | | 12/2004 |
| WO | WO-2007/069048 | | 6/2007 |
| WO | WO-2009/075281 | | 6/2009 |
| WO | WO-2009/136645 | | 11/2009 |

OTHER PUBLICATIONS

Nakamura et al., "The Phase Relations in the $In_2O_3$—$Ga_2ZnO_4$ ZnO System at 1350° C." Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m =3, 4, and 5), $InGaO_3(ZnO)_3$, and $Ga_2O_3(ZnO)_m$ (m =7, 8, 9, and 16) in the $In_2O_3$—$ZnGa_2O_4$—ZnO System," Journal of Solid State Chemistry, Apr. 1, 1995, vol. 116, No. 1, pp. 170-178.

Nakamura et al., "Syntheses and crystal structures of new homologous compounds, indium, iron zinc oxides ($InFeO_3(ZnO)_m$) (m: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," SCIENCE, May 23, 2003, vol. 300, No. 5623, pp. 1269-1272.

Nomura et al., "Room-Temperature Fabrication of Transparent Flexible Thin-Film Transistors Using Amorphous Oxide Semiconductors," NATURE, Nov. 25, 2004, vol. 432, pp. 488-492.

International Search Report (Application No. PCT/JP2011/050900) dated Mar. 1, 2011.

Written Opinion (Application No. PCT/JP2011/050900) dated Mar. 1, 2011.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takagashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Hayshi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osasa et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995

Li et al., "Modulated Structures of Homologous Compounds In $MO_3(ZnO)_m$(M =In,Ga; m =Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs" SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater (Advanced Materials), 2006, vol. 18, No. 3, pp. 339-342.

Tsuda et al., "Ultra Low Power Consumption Technologies for Mobile TFT-LCDs" IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1021-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1 Distinguished Paper: 12.1 WXGA AMOLED Display Driven by Indium—Gallium—Zinc Oxide TFTs Array" SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga —Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transistion: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors For AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs, " IDW '09: Proceedings of the $16^{th}$ International Display Workshops, 2009, pp. 689-692.

Park et al., "Amorphous Indium—Gallium—Zinc Oxide TFTs and their Application for Large Size AMOLED, " AM-FPD '08 Digest of Technical Papers, Jul. 2, 2008, pp. 275-278.

(56) References Cited

OTHER PUBLICATIONS

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 IN. QVGA AMOLED Display Using In—Ga—Zn—Oxide TFTs with a Novel Pssivation Layer," SID Digest '09: SID International Symposium Digest of Technical Papers, May 31, 2009, pp. 284-287.

Miyasaka, "Suftla Flexible Microelectronics on their Way to Business, " SID Digest '07: SID International Symposium Digest of Technical Papers, 2007, vol. 38, pp. 1673-1676.

Chern et al., "Ari Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1 Polarizer-Free Reflective LCD Combines with Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel YbFe$_2$O$_4$ and Yb$_2$Fe$_3$O$_7$ Types of Structures for Compounds in the In$_2$O$_3$ and Sc$_2$O$_3$—A$_2$O$_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks, " Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO$_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronics Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energies in ZnO: A hybrid Hartree-Fock density functional study," Phys. Rev. B. (Physical Review B), 2008, vol. 77, pp. 245202-1-245202-6.

Orita et al., "Amorphous transparent conductive oxide InGaO$_3$(ZnO)$_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induces damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on SrTiO$_3$ with Sputtered Al$_2$O$_3$ Gate insulator," Appl. Phys. Lett. (Applied Physics Letters), Sep. 1, 2003, vol. 83, No. 9, pp. 1755-1757.

Chinese Office Action (Application No. 201180005276.3) dated Aug. 22, 2014.

\* cited by examiner

FIG. 9A1
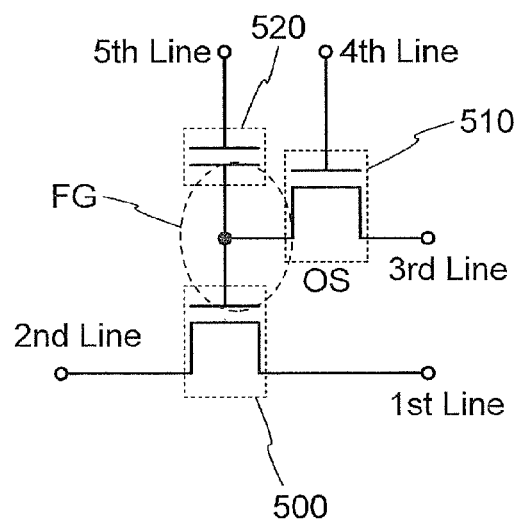
FIG. 9B
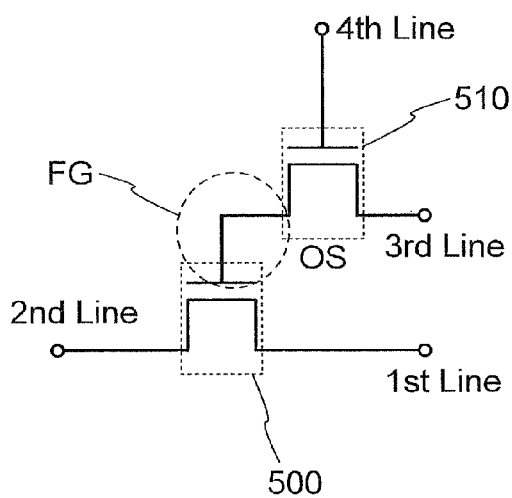
FIG. 9A2
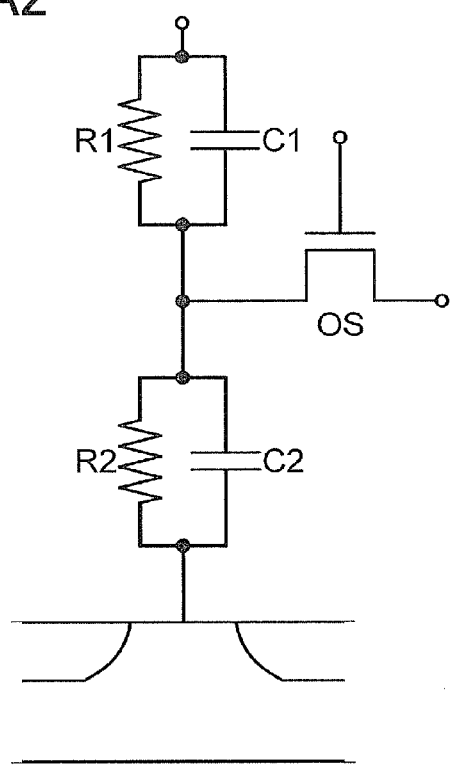

SEMICONDUCTOR DEVICE

TECHNICAL FIELD

The present invention relates to a semiconductor device. Here, semiconductor devices refer to general elements and devices which function by utilizing semiconductor characteristics.

BACKGROUND ART

There are a wide variety of metal oxides and such metal oxides are used for various applications. Indium oxide is a well-known material and has been used for transparent electrodes required in liquid crystal display devices or the like.

Some metal oxides have semiconductor characteristics. The examples of such metal oxides having semiconductor characteristics are, for example, tungsten oxide, tin oxide, indium oxide, zinc oxide, and the like. A thin film transistor in which a channel formation region is formed using such metal oxides is already known (for example, see Patent Documents 1 to 4, Non-Patent Document 1, and the like).

As metal oxides, not only single-component oxides but also multi-component oxides are known. For example, $InGaO_3(ZnO)_m$ (m: natural number) having a homologous phase is known as a multi-component oxide semiconductor including In, Ga, and Zn (for example, see Non-Patent Documents 2 to 4 and the like).

Furthermore, it is confirmed that an oxide semiconductor including such an In—Ga—Zn-based oxide is applicable to a channel formation region of a thin film transistor (for example, see Patent Document 5, Non-Patent Documents 5 and 6, and the like).

REFERENCE

Patent Documents

[Patent Document 1] Japanese Published Patent Application No. S60-198861
[Patent Document 2] Japanese Published Patent Application No. H08-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

DISCLOSURE OF INVENTION

In order to achieve high-speed operation, low power consumption, cost reduction, or the like of a transistor, it is necessary to miniaturize a transistor.

In the case where a transistor is miniaturized, a defect generated in a manufacturing process becomes a major problem. For example, in the case where a transistor is miniaturized, a short-channel effect becomes a problem. Here, the short-channel effect refers to degradation of electrical characteristics which becomes pronounced with miniaturization of a transistor (a reduction in channel length (L)). The short-channel effect results from the effect of an electric field of a drain on a source. Specific examples of the short-channel effect are decrease in the threshold voltage, increase in the subthreshold swing (S value), increase in leakage current, and the like. In particular, it is known that a transistor including an oxide semiconductor has small off-state current at room temperature as compared to a transistor including silicon. This is thought to be attributed to the fact that carriers generated by thermal excitation are few, that is, the carrier density is low. A transistor including a material having low carrier density tends to show a short-channel effect such as decrease in the threshold voltage.

Therefore, it is an object of one embodiment of the disclosed invention to provide a semiconductor device which achieves miniaturization while defects are suppressed. Further, it is another object to provide a semiconductor device which achieves miniaturization while favorable characteristics are maintained.

One embodiment of the present invention is a semiconductor device including an oxide semiconductor layer, a source electrode and a drain electrode in contact with the oxide semiconductor layer, a gate electrode overlapping with the oxide semiconductor layer, a gate insulating layer provided between the oxide semiconductor layer and the gate electrode, and an insulating layer provided in contact with the oxide semiconductor layer. A side surface of the oxide semiconductor layer is in contact with the source electrode or the drain electrode. An upper surface of the oxide semiconductor layer overlaps with the source electrode or the drain electrode with the insulating layer interposed between the oxide semiconductor layer and the source electrode or the drain electrode.

Another embodiment of the present invention is a semiconductor device including a gate electrode provided over a substrate, a gate insulating layer provided over the gate electrode, an oxide semiconductor layer provided over the gate insulating layer, an insulating layer provided on and in contact with the oxide semiconductor layer, and a source electrode and a drain electrode provided over the insulating layer and the gate insulating layer. A side surface of the oxide semiconductor layer is in contact with the source electrode or the drain electrode. An upper end of the side surface of the oxide semiconductor layer aligns with a lower end of a side surface of the insulating layer.

Another embodiment of the present invention is a semiconductor device including an oxide semiconductor layer provided over a substrate, an insulating layer provided on and in contact with the oxide semiconductor layer, a source electrode and a drain electrode provided over the substrate and the insulating layer, a gate insulating layer provided over the insulating layer, the source electrode, and the drain electrode, and a gate electrode provided over the gate insulating layer. A side surface of the oxide semiconductor layer is in contact with the source electrode or the drain electrode. An upper surface of the oxide semiconductor layer overlaps with the source electrode or the drain electrode with the insulating layer interposed between the oxide semiconductor layer and the source electrode or the drain electrode.

In the above structure, it is preferable that an upper end of the side surface of the oxide semiconductor layer align with a lower end of the side surface of the insulating layer. Further, it is preferable that each of the source electrode and the drain electrode include a first conductive layer and a second conductive layer having higher resistance than the first conductive layer and that the second conductive layer be in contact with the oxide semiconductor layer.

Another embodiment of the present invention is a semiconductor device including a gate electrode provided over a substrate, a gate insulating layer provided over the gate electrode, a source electrode and a drain electrode provided over the gate insulating layer each of which includes a first conductive layer and a second conductive layer having higher resistance than the first conductive layer, an oxide semiconductor layer which overlaps with the gate electrode and is provided in contact with the second conductive layer, and an insulating layer provided between the first conductive layer and the oxide semiconductor layer.

In the above structure, it is preferable that the second conductive layer have a region extending beyond a side surface of the first conductive layer in a channel length direction. In addition, the thickness of the second conductive layer is preferably 5 nm to 15 nm. Moreover, the second conductive layer is preferably formed of a nitride of a metal.

Here, semiconductor devices refer to general devices which function by utilizing semiconductor characteristics. For example, a display device, a memory device, an integrated circuit, and the like are included in the category of the semiconductor device.

In this specification and the like, the term such as "over" or "below" does not necessarily mean that a component is placed "directly on" or "directly below" another component. For example, the expression "a gate electrode over a gate insulating layer" can mean the case where there is an additional component between the gate insulating layer and the gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

According to one embodiment of the disclosed invention, an electric field between the source electrode and the drain electrode can be relaxed when the vicinity of the interface where the oxide semiconductor layer is in contact with the source electrode or the drain electrode is made to be a high resistance region. Therefore, a short-channel effect such as decrease in the threshold voltage can be suppressed.

Thus, the problems with miniaturization can be solved. As a result, the size of the transistor can be sufficiently reduced. When the size of the transistor is sufficiently reduced, the size of a semiconductor device is also reduced and thus the number of semiconductor devices manufactured from one substrate is increased. Accordingly, manufacturing cost per semiconductor device is reduced. Since the semiconductor device is miniaturized, a semiconductor device with a size similar to that of the conventional semiconductor device can have improved functions. Further, effects such as high speed operation, reduction in power consumption, and the like can be obtained because of reduction in channel length. That is, miniaturization of a transistor including an oxide semiconductor is achieved in accordance with one embodiment of the disclosed invention, and various effects accompanying therewith can also be obtained.

In this manner, according to one embodiment of the disclosed invention, a semiconductor device which achieves miniaturization while defects are suppressed or favorable characteristics are maintained can be provided.

BRIEF DESCRIPTION OF DRAWINGS

In the accompanying drawings:

FIGS. 9A1, 9A2, and 9B are each an example of a circuit diagram of a semiconductor device;

BEST MODE FOR CARRYING OUT THE INVENTION

Figure 1A:
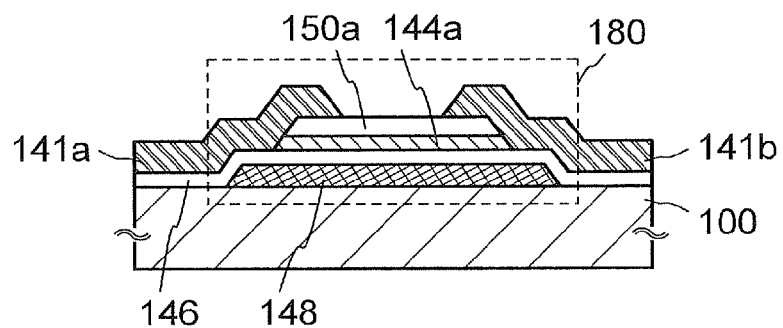
FIGS. 1A and 1B are each a cross sectional view of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiment.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

In this embodiment, a structure and a manufacturing process of a semiconductor device according to one embodiment of the disclosed invention will be described with reference to FIGS. 1A and 1B and FIGS. 2A to 2E.

<Example of Structure of Semiconductor Device>

Figure 1B:
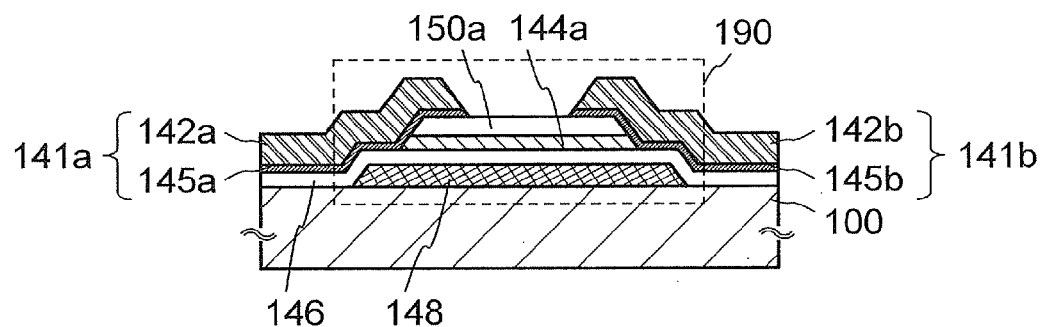

FIGS. 1A and 1B each illustrate a cross-sectional structure of a transistor as an example of a semiconductor device. In each of FIGS. 1A and 1B, a bottom gate transistor is illustrated as a transistor of one embodiment of the disclosed invention.

A transistor 180 illustrated in FIG. 1A includes, over a substrate 100, a gate electrode 148, a gate insulating layer 146 provided over the gate electrode 148, an oxide semiconductor layer 144a provided over the gate insulating layer 146, an insulating layer 150a provided on and in contact with the oxide semiconductor layer 144a, and a source electrode 141a and a drain electrode 141b provided over the gate insulating layer 146 and the insulating layer 150a.

In the transistor 180 illustrated in FIG. 1A, side surfaces of the oxide semiconductor layer 144a are in contact with the source electrode 141a and the drain electrode 141b. Further, upper ends of the side surfaces of the oxide semiconductor layer 144a align with lower ends of side surfaces of the insulating layer 150a and the oxide semiconductor layer 144a overlaps with the source electrode 141a and the drain electrode 141b with the insulating layer 150a over the oxide semiconductor layer 144a therebetween. That is, the oxide semiconductor layer 144a is in contact with the source electrode 141a and the drain electrode 141b only at the side surfaces.

In this specification, the "side surface" means a surface generated in such a manner that an oxide semiconductor layer, a conductive film, or the like is cut in a direction substantially perpendicular to a surface of the substrate. Further, the "side surface" means a surface generated in such a manner that an oxide semiconductor layer, a conductive film, or the like is cut at a range of ±30° to ±60° with respect to a direction perpendicular to the surface of the substrate. That is, the "side surface" means a cut surface generated by etching a film-like structure. Note that in this specification, "aligning with" includes "substantially aligning with". For example, a side surface of a layer A and a side surface of a layer B, which are included in a stacked structure and etched using the same mask, are considered to align with each other.

Alternatively, as in a transistor 190 illustrated in FIG. 1B, a structure in which the source electrode 141a has a structure in which a second conductive layer 145a and a first conductive layer 142a are stacked in this order and the drain electrode 141b has a structure in which a second conductive layer 145b and a first conductive layer 142b are stacked in this order may be employed.

<Example of Manufacturing Steps of Transistor>

An example of steps of manufacturing the transistor illustrated in FIG. 1A will be described with reference to FIGS. 2A to 2E below.

Figure 2A:
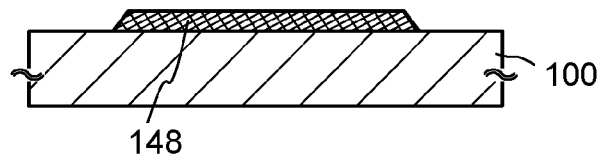
FIGS. 2A to 2E are cross-sectional views of manufacturing steps of a semiconductor device.

First, a conductive film is formed over the substrate 100 having an insulating surface and the conductive film is selectively etched into the gate electrode 148 (see FIG. 2A). Note that the entire surface of the substrate 100 is not necessarily an insulating surface and part may be conductive.

Although there is no particular limitation on a substrate which can be used as the substrate 100, it is necessary that the substrate have at least heat resistance high enough to withstand heat treatment performed later. For example, a substrate such as a glass substrate, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as long as the substrate has an insulating surface. A semiconductor element may be provided over the substrate. Further, a base film may be provided over the substrate 100.

The conductive film to be the gate electrode 148 can be formed by a PVD method typified by a sputtering method or a CVD method such as a plasma CVD method. As a material of the conductive film to be the gate electrode 148, an element selected from aluminum, chromium, copper, tantalum, titanium, molybdenum, and tungsten, a nitride thereof, an alloy containing any of the above elements as its component, or the like can be used. One or more materials selected from manganese, magnesium, zirconium, and beryllium may be used. Alternatively, aluminum combined with one or more of elements selected from titanium, tantalum, tungsten, molybdenum, chromium, neodymium, and scandium may be used. Further alternatively, a conductive metal oxide such as indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), an alloy of indium oxide and zinc oxide ($In_2O_3$—ZnO), or any of these metal oxide materials in which silicon or silicon oxide is included can be used.

Note that when the work function of the material of the gate electrode 148 is substantially the same as or smaller than the electron affinity of the oxide semiconductor layer 144a, the threshold voltage of the transistor might shift in the negative direction in miniaturization of the transistor. Accordingly, it is preferable that a material which has the work function larger than the electron affinity of the oxide semiconductor layer 144a be used for the gate electrode 148. As such materials, for example, tungsten, platinum, gold, silicon to which p-type conductivity is imparted, or the like is given.

Further, the gate electrode 148 may have a single-layer structure or a stacked-layer structure of two or more layers. The thickness of the gate electrode 148 is 10 nm to 400 nm, preferably 100 nm to 200 nm.

Here, ultraviolet light, a KrF laser beam, or an ArF laser beam is preferably used for light exposure for forming a mask used in etching to form the gate electrode 148. Particularly for light exposure in the case where the processing dimension is less than 25 nm, light exposure for forming a mask is preferably performed with extreme ultraviolet light whose wavelength is several nanometers to several tens of nanometers, which is extremely short. In light exposure using extreme ultraviolet light, resolution is high and depth of focus is large, which are suitable for miniaturization.

In etching the conductive film, end portions of the gate electrode 148 are preferably tapered as illustrated in FIG. 2A. This is for the prevention of disconnection of the gate insulating layer 146 or the like when the gate insulating layer 146 or the like is formed over the gate electrode 148 in a later step.

Figure 2B:
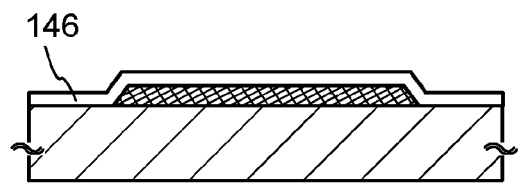

Next, the gate insulating layer 146 is formed so as to cover the gate electrode 148 (see FIG. 2B).

The gate insulating layer 146 can be formed by a CVD method, a sputtering method, or the like. The gate insulating layer 146 is preferably formed so as to include silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. Note that the gate insulating layer 146 may have a single-layer structure or a layered structure. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

As described above, when the gate insulating layer 146 is thin, there is a problem of gate leakage due to a tunneling effect or the like. In order to solve the problem of gate leakage, it is preferable that the gate insulating layer 146 be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. With the use of a material with a high dielectric constant (high-k) material for the gate insulating layer 146, the thickness of the gate insulating layer 146 can be large so as to ensure electrical characteristics and prevent gate leakage. Note that a stacked structure of a film including a high dielectric constant (high-k) material and a film including any of silicon oxide, silicon nitride, silicon oxynitride, silicon nitride oxide, aluminum oxide, and the like may also be employed.

Figure 2C:
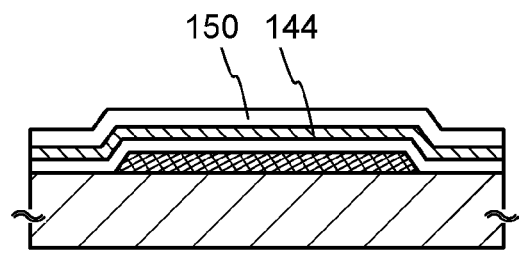

Next, an oxide semiconductor layer 144 is formed over the gate insulating layer 146 by a sputtering method and an insulating layer 150 is formed over the oxide semiconductor layer 144 (see FIG. 2C).

As the oxide semiconductor layer 144, an In—Sn—Ga—Zn—O-based oxide semiconductor layer which is a four-component metal oxide; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, or a Sn—Al—Zn—O-based oxide semiconductor layer which are three-component metal oxide; an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer, or an In—Mg—O-based oxide semiconductor layer which are two-component metal oxide; or an In—O-based oxide semiconductor layer, a Sn—O-based oxide semiconductor layer or a Zn—O-based oxide semiconductor layer which are single-component metal oxide can be used.

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a material used in a semiconductor device.

As a typical example of the In—Ga—Zn—O-based oxide semiconductor material, one represented by InGaO$_3$(ZnO)$_m$ (m>0) is given. Further, there is an oxide semiconductor material represented by InMO$_3$(ZnO)$_m$ (m>0) using M instead of Ga. Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

As a target for forming the oxide semiconductor layer 144 by a sputtering method, a target having a composition ratio of In:Ga:Zn=1:x:y (x is greater than or equal to 0, and y is greater than or equal to 0.5 and less than or equal to 5) is preferable. For example, a metal oxide target having a composition ratio of In:Ga:Zn=1:1:1 [atomic ratio] (x=1, y=1) (i.e., In$_2$O$_3$:Ga$_2$O$_3$:ZnO=1:1:2 [molar ratio]) can be used. Alternatively, a metal oxide target having a composition ratio of In:Ga:Zn=1:1:0.5 [atomic ratio] (x=1, y=0.5) (i.e., In$_2$O$_3$:Ga$_2$O$_3$:ZnO=1:1:1 [molar ratio]); a metal oxide target having a composition ratio of In:Ga:Zn=1:1:2 [atomic ratio] (x=1, y=2) (i.e., In$_2$O$_3$:Ga$_2$O$_3$:ZnO=1:1:4 [molar ratio]); or a metal oxide target having a composition ratio of In:Ga:Zn=1:0:1 [atomic ratio] (x=0, y=1) (i.e., In$_2$O$_3$:ZnO=1:2 [molar ratio]) can be used.

In this embodiment, the oxide semiconductor layer 144 having an amorphous structure is formed by a sputtering method using an In—Ga—Zn—O-based metal oxide target.

The relative density of the metal oxide in the metal oxide target is greater than or equal to 80%, preferably greater than or equal to 95%, and more preferably greater than or equal to 99.9%. With the use of the metal oxide target with high relative density, the oxide semiconductor layer 144 having a dense structure can be formed.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use, for example, a high-purity gas atmosphere from which an impurity such as hydrogen, water, a hydroxyl group, or hydride is removed to a concentration of 1 ppm or less (preferably, 10 ppb or less).

In forming the oxide semiconductor layer 144, for example, an object to be processed (here, a structure including the substrate 100) is held in a treatment chamber that is kept under reduced pressure and the object to be processed is heated so that the temperature of the object to be processed is higher than or equal to 100° C. and lower than 550° C., preferably higher than or equal to 200° C. and lower than or equal to 400° C. Alternatively, the temperature of the object to be processed in forming the oxide semiconductor layer 144 may be room temperature. Then, a sputtering gas from which hydrogen, water, and the like are removed is introduced while moisture in the treatment chamber is removed, whereby the oxide semiconductor layer 144 is formed using the above-described metal oxide target. In forming the oxide semiconductor layer 144 while heating the object to be processed, impurities in the oxide semiconductor layer 144 can be reduced. In addition, damage due to the sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By evacuation with the cryopump or the like, hydrogen, water, and the like can be removed from the treatment chamber, whereby the impurity concentration of the oxide semiconductor layer 144 can be reduced.

The oxide semiconductor layer 144 can be formed under the following conditions, for example: the distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that it is preferable to use a pulsed direct-current (DC) power source because dust (such as powder substances generated at the time of deposition) can be reduced and the thickness distribution is uniform. The thickness of the oxide semiconductor layer 144 is greater than or equal to 3 nm and less than or equal to 30 nm, preferably greater than or equal to 5 nm and less than or equal to 15 nm, for example. When the oxide semiconductor layer 144 has such a thickness, a contact area between the oxide semiconductor layer 144a and the source electrode 141a to be formed later and a contact area between the oxide semiconductor layer 144a and the drain electrode 141b to be formed later can be reduced, so that a short-channel effect due to miniaturization can be suppressed. Note that an appropriate thickness varies depending on the material for the oxide semiconductor, the usage of the semiconductor device, or the like, and thus the thickness can be selected as appropriate depending on the material, the usage, or the like.

Note that before the oxide semiconductor layer 144 is formed by a sputtering method, a substance attached to a surface to be processed (e.g., a surface of the gate insulating layer 146) is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere and plasma is generated in the vicinity of the object. Note that an atmosphere of nitrogen, helium, oxygen, or the like may be used instead of an argon atmosphere.

Then, the insulating layer 150 is formed over the oxide semiconductor layer 144. The insulating layer 150 is formed to have a thickness of greater than or equal to 1 nm and less than or equal to 50 nm, preferably greater than or equal to 3 nm and less than or equal to 10 nm, for example. In this embodiment, a silicon oxide film is formed as the insulating layer 150.

Further, the oxide semiconductor layer 144 and the insulating layer 150 may be formed successively without exposure to the air. By successive formation, the interface between the oxide semiconductor layer 144 and the insulating layer 150 can be formed without being contaminated with air components or contamination impurity elements (e.g., hydrogen or water) contained in the air; thus, variations in characteristics of transistors can be reduced.

Figure 2D:
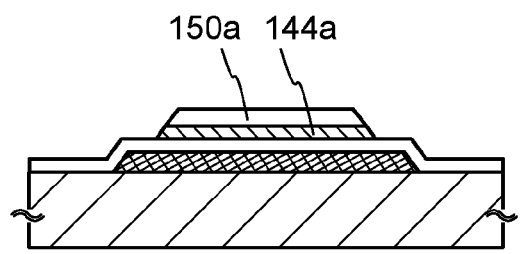

Next, the oxide semiconductor layer 144 and the insulating layer 150 are selectively etched by a method such as etching with the use of a mask to form the island-shaped oxide semiconductor layer 144a and the island-shaped insulating layer 150a (see FIG. 2D). Here, the island-shaped oxide semiconductor layer 144a is formed in a region overlapping with the gate electrode 148.

Ultraviolet light, a KrF laser beam, or an ArF laser beam is preferably used for light exposure for forming a mask used in etching to form the island-shaped oxide semiconductor layer 144a and the island-shaped insulating layer 150a. Particularly for light exposure in the case where the channel length (L) is less than 25 nm, light exposure for forming a mask is preferably performed with extreme ultraviolet light whose wavelength is several nanometers to several tens of nanometers, which is extremely short. In light exposure using extreme ultraviolet light, resolution is high and depth of focus is large, which are suitable for miniaturization.

Wet etching or dry etching can be used in etching of the insulating layer 150 and the oxide semiconductor layer 144 and wet etching and dry etching can be used in combination. The etching conditions (e.g., an etching gas, an etchant, etching time, and temperature) are set as appropriate depending on the material so that the insulating layer 150 and the oxide semiconductor layer 144 can be etched into desired shapes. Note that dry etching is preferably used for reduction in channel length (L) of a transistor. As an etching gas used in dry etching, for example, a gas containing fluorine such as sulfur hexafluoride ($SF_6$), nitrogen trifluoride ($NF_3$), trifluoromethane ($CHF_3$), or octafluorocyclobutane ($C_4F_8$), a mixed gas of tetrafluoromethane ($CF_4$) and hydrogen, or the like can be used. Furthermore, a rare gas (e.g., helium (He), argon (Ar), or xenon (Xe)), carbon monoxide, carbon dioxide, or the like may be added to the above gas.

As the dry etching, a parallel plate reactive ion etching (RIE) method, an inductively coupled plasma (ICP) etching method, or the like can be used. Also in this case, etching conditions (e.g., the amount of electric power applied to a coiled electrode, the amount of electric power applied to an electrode on the substrate side, and the electrode temperature on the substrate side) need to be set as appropriate.

In addition, in etching of the oxide semiconductor layer 144 and the insulating layer 150, end portions of the oxide semiconductor layer 144 and the insulating layer 150 are preferably tapered as illustrated in FIG. 2D. This is for the prevention of disconnection of the source electrode 141a and the drain electrode 141b when the source electrode 141a and the drain electrode 141b are formed over the oxide semiconductor layer 144 and the insulating layer 150 in a later step.

As described above, the insulating layer 150 and the oxide semiconductor layer 144 are collectively etched, so that the upper ends of the side surfaces of the oxide semiconductor layer 144a can easily align with the lower ends of the side surfaces of the insulating layer 150a.

Here, the channel length (L) of the transistor 180 is determined in accordance with the width of the oxide semiconductor layer 144a. Although an appropriate channel length (L) differs depending on the usage of the transistor 180, the channel length (L) can be greater than or equal to 10 nm and less than or equal to 1000 nm, preferably greater than or equal to 20 nm and less than or equal to 400 nm, for example.

In this embodiment, the insulating layer 150 and the oxide semiconductor layer 144 are collectively etched; however, these is no limitation thereto and the insulating layer 150 and the oxide semiconductor layer 144 can be individually etched. Further, it is possible that the oxide semiconductor layer 144 is formed and selectively etched into the island-shaped oxide semiconductor layer 144a, and then the insulating layer 150 is formed and selectively etched into the island-shaped insulating layer 150a.

After that, heat treatment (first heat treatment) is preferably performed on the oxide semiconductor layer 144. Through the first heat treatment, excessive hydrogen (including water or a hydroxyl group) in the oxide semiconductor layer 144 is removed, a structure of the oxide semiconductor layer 144 is improved, and defect levels in an energy gap can be reduced. The first heat treatment is performed at a temperature higher than or equal to 300° C. and lower than 550° C., or higher than or equal to 400° C. and lower than or equal to 500° C., for example.

The heat treatment can be performed in such a way that, for example, an object to be heated is introduced into an electric furnace in which a resistance heating element or the like is used, and heated under a nitrogen atmosphere at 450° C. for one hour. The oxide semiconductor layer 144 is not exposed to the air during the heat treatment so that entry of water and hydrogen can be prevented.

The heat treatment apparatus is not limited to the electric furnace and may be an apparatus for heating an object by thermal conduction or thermal radiation from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The object is put in an inert gas atmosphere that has been heated, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect levels in an energy gap due to oxygen deficiency can be reduced by the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm).

In any case, impurities are reduced by the first heat treatment so that the i-type (intrinsic) or substantially i-type oxide semiconductor layer 144 is obtained. Accordingly, a transistor having extremely excellent characteristics can be realized.

The above heat treatment (first heat treatment) can be referred to as dehydration treatment, dehydrogenation treatment, or the like because of its effect of removing hydrogen, water, and the like. The dehydration treatment or the dehydrogenation treatment can be performed after formation of the oxide semiconductor layer 144, after formation of the insulating layer 150, after formation of the source electrode 141a and the drain electrode 141b, or the like. Such dehydration treatment or dehydrogenation treatment may be conducted once or plural times.

Figure 2E:
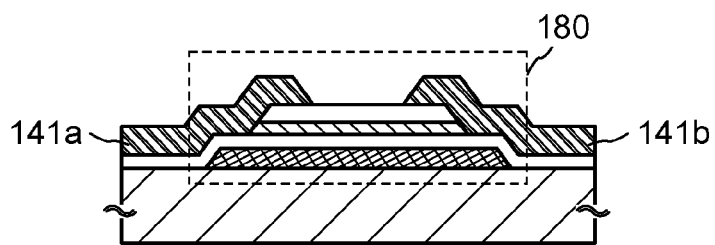

Next, a conductive film is formed over the gate insulating layer 146 and the insulating layer 150a so as to be in contact with the side surfaces of the oxide semiconductor layer 144a, and the conductive film is selectively etched into the source electrode 141a and the drain electrode 141b (see FIG. 2E).

The thickness of the conductive film to be the source electrode 141a and the drain electrode 141b is, for example, greater than or equal to 50 nm and less than or equal to 500 nm. The conductive film to be the source electrode 141a and the drain electrode 141b can be formed by a PVD method such as a sputtering method or a CVD method such as a plasma CVD method.

As a material of the conductive film to be the source electrode 141a and the drain electrode 141b, an element selected from aluminum, chromium, copper, tantalum, titanium, molybdenum, and tungsten, a nitride thereof, an alloy containing any of the above elements as its component, or the like can be used. One or more materials selected from manganese, magnesium, zirconium, and beryllium may be used. Alternatively, aluminum combined with one or more of elements selected from titanium, tantalum, tungsten, molybdenum, chromium, neodymium, and scandium may be used. Further alternatively, a conductive metal oxide such as indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), an alloy of indium oxide and zinc oxide ($In_2O_3$—ZnO), or any of these metal oxide materials in which silicon or silicon oxide is included can be used.

Note that when a metal material which has the work function larger than the electron affinity of the oxide semiconductor layer 144a is used as a material of the conductive film to be the source electrode 141a and the drain electrode 141b, resistance at the contact interface with the oxide semiconductor layer 144a can be increased, which is preferable. As such a metal material, gold, platinum, tungsten nitride, an alloy of indium oxide and tin oxide, or the like can be given, for example. Further, it is preferable to use a material which does not chemically react with the oxide semiconductor layer 144a by contact as the material of the conductive film to be the source electrode 141a and the drain electrode 141b.

The conductive film to be the source electrode 141a and the drain electrode 141b can be etched by wet etching or dry etching. Alternatively, wet etching and dry etching may be used in combination. The etching conditions (e.g., an etching gas, an etchant, etching time, and temperature) are set as appropriate depending on the material so that the conductive film can be etched into a desired shape. In the case where the conductive film to be the source electrode 141a and the drain electrode 141b is etched by dry etching, chlorine ($Cl_2$), boron trichloride ($BCl_3$), silicon tetrachloride ($SiCl_4$), tetrafluoromethane ($CF_4$), sulfur hexafluoride ($SF_6$), nitrogen trifluoride ($NF_3$), or the like can be used as an etching gas. Further, a mixed gas containing a plurality of the above gases may be used. Furthermore, a rare gas (helium (He) or argon (Ar)), oxygen, or the like may be added to the above gas.

The source electrode 141a and the drain electrode 141b are thus formed, whereby the side surfaces of the oxide semiconductor layer 144a are in contact with the source electrode 141a and the drain electrode 141b. Further, the upper ends of the side surfaces of the oxide semiconductor layer 144a align with the lower ends of the side surfaces of the insulating layer 150a, and the oxide semiconductor layer 144a overlaps with the source electrode 141a and the drain electrode 141b with the insulating layer 150a over the oxide semiconductor layer 144a therebetween. That is, the oxide semiconductor layer 144a is in contact with the source electrode 141a and the drain electrode 141b only at the side surfaces.

Thus, when the side surfaces of the oxide semiconductor layer 144a is in contact with the source electrode 141a and the drain electrode 141b and the insulating layer 150a covers the upper surface of the oxide semiconductor layer 144a, a contact area between the source electrode 141a and the oxide semiconductor layer 144a and a contact area between the drain electrode 141b and the oxide semiconductor layer 144a can be reduced. Accordingly, contact resistance at the contact interface can be increased.

In the transistor 180 described in this embodiment, when contact resistance between the source electrode 141a and the oxide semiconductor layer 144a and contact resistance between the drain electrode 141b and the oxide semiconductor layer 144a are increased, an electric field applied to the oxide semiconductor layer 144a can be relaxed and a short-channel effect can be suppressed even when the channel length (L) of the transistor 180 is shortened.

Note that the oxide semiconductor layer 144a is not necessarily in contact with the source electrode 141a and the drain electrode 141b only at the side surfaces. Part of the upper surface of the oxide semiconductor layer 144a may be in contact with the source electrode 141a and the drain electrode 141b as long as the contact area between the source electrode 141a and the oxide semiconductor layer 144a and the contact area between the drain electrode 141b and the oxide semiconductor layer 144a can be reduced.

When the conductive film to be the source electrode 141a and the drain electrode 141b has a stacked structure including a first conductive film and a second conductive film, the source electrode 141a can have a structure in which the second conductive layer 145a and the first conductive layer 142a are stacked in this order and the drain electrode 141b can have a structure in which the second conductive layer 145b and the first conductive layer 142b are stacked in this order, as in the transistor 190 illustrated in FIG. 1B. In that case, the thickness of the first conductive film is greater than or equal to 50 nm and less than or equal to 500 nm. The thickness of the second conductive film is greater than or equal to 3 nm and less than or equal to 30 nm, preferably greater than or equal to 5 nm and less than or equal to 15 nm.

The first conductive film and the second conductive film can be formed using a material and by a formation method similar to those of the source electrode 141a and the drain electrode 141b. The first conductive film may have a single-layer structure or a stacked structure of two or more layers. For example, the first conductive film can have a single-layer structure of a titanium film, a single-layer structure of an aluminum film containing silicon, a two-layer structure in which a titanium film is stacked over an aluminum film, or a three-layer structure in which a titanium film, an aluminum film, and a titanium film are stacked in this order.

Note that when a metal material which has the work function larger than the electron affinity of the oxide semiconductor layer 144a is used as a material of the second conductive film, resistance at the contact interface with the oxide semiconductor layer 144a can be increased, which is preferable. As such a metal material, gold, platinum, tungsten nitride, an alloy of indium oxide and tin oxide, or the like can be given, for example. Further, when a material which has higher resistance than the first conductive film is used as a material of the second conductive film, in the source electrode and the drain electrode of the transistor 190 to be formed, a region in contact with a channel formation region of the oxide semiconductor layer 144a becomes to have higher resistance than other regions, so that an electric field between the source electrode and the drain electrode can be relaxed and a short-channel effect can be suppressed, which is preferable. Furthermore, since the second conductive layers 145a and 145b are in contact with the oxide semiconductor layer 144a, a material which does not chemically react with the oxide semiconductor layer 144a by contact is preferably used for the second conductive film.

For example, it is preferable to form a molybdenum nitride film as the second conductive film and a titanium film as the first conductive film.

The first conductive film and the second conductive film can be etched in a manner similar to etching of the conductive film to be the source electrode 141a and the drain electrode 141b.

After formation of the source electrode 141a and the drain electrode 141b, second heat treatment is desirably performed in an inert gas atmosphere or an oxygen atmosphere. The second heat treatment is performed at a temperature of higher than or equal to 200° C. and lower than or equal to 450° C., preferably higher than or equal to 250° C. and lower than or equal to 350° C. For example, the heat treatment may be performed in a nitrogen atmosphere at 250° C. for one hour. The second heat treatment can reduce variations in electric characteristics of the transistors. Moreover, in the case where the insulating layer 150a contains oxygen, oxygen is supplied to the oxide semiconductor layer 144a to compensate oxygen deficiency in the oxide semiconductor layer 144a, whereby an i-type (intrinsic) or substantially i-type oxide semiconductor layer can be formed.

Note that the second heat treatment is performed after the source electrode 141a and the drain electrode 141b are formed in this embodiment; however, the timing of the second heat treatment is not particularly limited to this. For example, the second heat treatment may be performed after a protective insulating layer is formed over the transistor 180. Alternatively, the second heat treatment may be performed following the first heat treatment, the first heat treatment may also serve as the second heat treatment, or the second heat treatment may also serve as the first heat treatment.

As described above, at least one of the first heat treatment and the second heat treatment is performed, whereby the oxide semiconductor layer 144a can be purified in order to include an impurity other than its main component as little as possible. Thus, the concentration of hydrogen in the oxide semiconductor layer 144a can be $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Further, the oxide semiconductor layer 144a can have a sufficiently low carrier density (e.g., lower than $1 \times 10^{12}$/cm$^3$, preferably lower than $1.45 \times 10^{10}$/cm$^3$) as compared to a general silicon wafer having a carrier density of approximately $1 \times 10^{14}$/cm$^3$. Because of this, the off-state current is sufficiently reduced. For example, the off-state current (here, current per micrometer (μm) of channel width) of the transistor 180 at room temperature is 100 zA/μm (1 zA (zeptoampere) is $1 \times 10^{-21}$ A) or less, preferably 10 zA/μm or less.

Through the above steps, the transistor 180 including the oxide semiconductor layer 144a is completed.

Thus, when the oxide semiconductor layer 144a is in contact with the source electrode 141a and the drain electrode 141b only at the side surfaces and the insulating layer 150a covers the upper surface of the oxide semiconductor layer 144a, a contact area between the source electrode 141a and the oxide semiconductor layer 144a and a contact area between the drain electrode 141b and the oxide semiconductor layer 144a can be reduced. Accordingly, contact resistance at the contact interface can be increased.

In the transistor 180 described in this embodiment, since the oxide semiconductor layer 144a is in contact with the source electrode 141a and the drain electrode 141b only at the side surfaces, contact resistance between the source electrode 141a and the oxide semiconductor layer 144a and contact resistance between the drain electrode 141b and the oxide semiconductor layer 144a are increased, whereby an electric field applied to the oxide semiconductor layer 144a can be relaxed and a short-channel effect such as decrease in the threshold voltage can be suppressed.

Thus, in one embodiment of the disclosed invention, the problems with miniaturization can be solved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing cost per semiconductor device is reduced. Since the semiconductor device is miniaturized, a semiconductor device with a size similar to that of the conventional semiconductor device can have improved functions. Further, effects such as high speed operation, reduction in power consumption, and the like can be obtained because of reduction in channel length. That is, miniaturization of a transistor including an oxide semiconductor is achieved in accordance with one embodiment of the disclosed invention, and various effects accompanying therewith can also be obtained.

The structures, methods, and the like described in this embodiment can be combined as appropriate with any of the structures, methods, and the like described in the other embodiments.

Embodiment 2

In this embodiment, a structure and a manufacturing process of a semiconductor device according to one embodiment of the disclosed invention, which are different from those of Embodiment 1, will be described with reference to FIGS. 3A to 3C and FIGS. 4A to 4F.

<Example of Structure of Semiconductor Device>

Figure 3A:
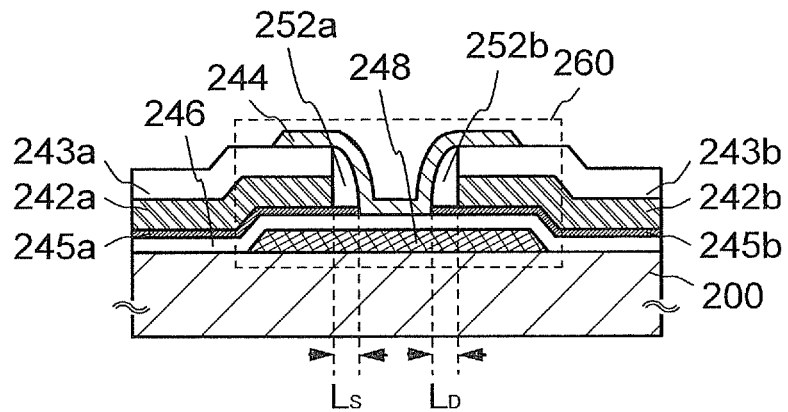
FIGS. 3A to 3C are each a cross-sectional view of a semiconductor device.

A transistor 260 illustrated in FIG. 3A is an example of a structure of a semiconductor device. The transistor 260 includes a gate electrode 248 provided over a substrate 200, a gate insulating layer 246 provided over the gate electrode 248, a source electrode including a second conductive layer 245a provided over the gate insulating layer 246 and a first conductive layer 242a having lower resistance than the second conductive layer 245a, a drain electrode including a second conducive layer 245b provided over the gate insulating layer 246 and a first conductive layer 242b having lower resistance than the second conductive layer 245b, an oxide semiconductor layer 244 which overlaps with the gate electrode 248 and is provided in contact with the second conductive layers 245a and 245b, an insulating layer 243a provided between the first conductive layer 242a and the oxide semiconductor layer 244, and an insulating layer 243b provided between the first conductive layer 242b and the oxide semiconductor layer 244.

In the transistor 260 illustrated in FIG. 3A, the second conductive layer 245a has a region extending beyond a side surface of the first conductive layer 242a in a channel length direction and the second conductive layer 245a is in contact with at least a channel formation region of the oxide semiconductor layer 244. Further, the second conductive layer 245b has a region extending beyond a side surface of the first conductive layer 242b in a channel length direction and the second conductive layer 245b is in contact with at least the channel formation region of the oxide semiconductor layer 244.

Further, in the transistor 260 illustrated in FIG. 3A, a sidewall insulating layer 252a is provided over the region of the second conductive layer 245a, which extends beyond the side surface of the first conductive layer 242a in a channel length direction, and a sidewall insulating layer 252b is provided over the region of the second conductive layer 245b, which extends beyond the side surface of the first conductive layer 242b in a channel length direction. The sidewall insulating layer 252a is provided in contact with the oxide semiconductor layer 244, the second conductive layer 245a, the first conductive layer 242a, and the insulating layer 243a. Further, the sidewall insulating layer 252a has a curved shape at least in part of a region in contact with the oxide semiconductor layer 244. The sidewall insulating layer 252b is provided in contact with the oxide semiconductor layer 244, the second conductive layer 245b, the first conductive layer 242b, and the insulating layer 243b. Further, the sidewall insulating layer 252b has a curved shape at least in part of a region in contact with the oxide semiconductor layer 244.

Note that in the transistor 260 illustrated in FIG. 3A, an example in which the second conductive layer 245a and the first conductive layer 242a are stacked in this order and the second conductive layer 245b and the first conductive layer 242b are stacked in this order is described; however, one embodiment of the present invention is not limited to this. For example, as in a transistor 270 illustrated in FIG. 3B, a structure in which the first conductive layer 242a and the second conductive layer 245a are stacked in this order and the first conductive layer 242b and the second conductive layer 245b are stacked in this order may be employed. Also in that case, it is preferable that the second conductive layer 245a have a region extending beyond the side surface of the first conducive layer 242a in a channel length direction and be in contact with at least the channel formation region of the oxide semiconductor layer 244. Similarly, it is preferable that the second conductive layer 245b have a region extending beyond the side surface of the first conducive layer 242b in a channel length direction and be in contact with at least the channel formation region of the oxide semiconductor layer 244. In this case, the insulating layer 243a is provided between the second conductive layer 245a and the oxide semiconductor layer 244 and the insulating layer 243b is provided between the second conductive layer 245b and the oxide semiconductor layer 244.

Figure 3B:
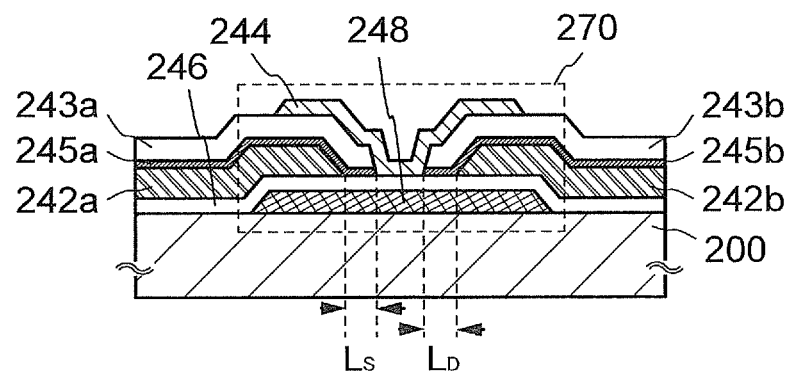
Figure 3C:
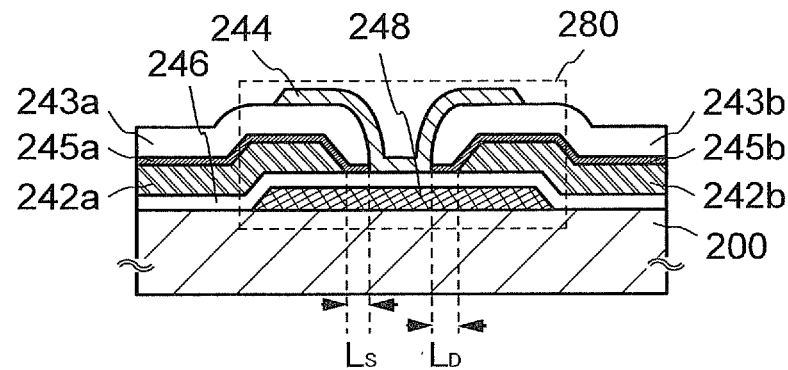

Alternatively, as in a transistor 280 illustrated in FIG. 3C, each of the insulating layers 243a and 243b may have a curved shape at least in part of a region in contact with the oxide semiconductor layer 244.

When the source electrode has a stacked structure of the first conductive layer 242a and the second conductive layer 245a and the drain electrode has a stacked structure of the first conductive layer 242b and the second conductive layer 245b, and the second conductive layers 245a and 245b are provided with the regions extending beyond the side surfaces of the first conductive layers 242a and 242b in a channel length direction, voltage is decreased in the regions and thus an electric field applied to the oxide semiconductor layer is relaxed. Accordingly, a short-channel effect can be suppressed. Further, coverage when the oxide semiconductor layer 244 is formed over the source electrode and the drain electrode is improved. Furthermore, the insulating layers have a curved shape at least in part of a region in contact with the oxide semiconductor layer 244, whereby coverage when the oxide semiconductor layer 244 is formed is improved. Therefore, defective film formation or the like is prevented.

<Example of Manufacturing Steps of Transistor 260>

Next, an example of manufacturing steps of the transistor 260 will be described with reference to FIGS. 4A to 4F.

First, a conductive film is formed over the substrate 200 and then selectively etched into the gate electrode 248. Next, the gate insulating layer 246 is formed so as to cover the gate electrode 248 (see FIG. 4A).

Here, a substrate similar to the substrate 100 described in Embodiment 1 can be used as the substrate 200. The gate electrode 248 can be formed using a material and a film formation method similar to those of the gate electrode 148 described in Embodiment 1. The gate insulating layer 246 can be formed using a material and a film formation method similar to those of the gate insulating layer 146 described in Embodiment 1. Embodiment 1 can be referred to for the details.

Next, after formation of a second conductive film 245 over the gate insulating layer 246, a first conductive film is formed over the second conductive film 245 and an insulating film is formed over the first conductive film. Next, a mask is formed over the insulating film and the insulating film and the first conductive film are etched into the insulating layers 243a and 243b and the first conductive layers 242a and 242b (see FIG. 4B).

Here, the second conductive film, the first conductive film, and the insulating film can be formed using materials and film formation methods similar to those of the second conductive film, the first conductive film, and the insulating film described in Embodiment 1. Embodiment 1 can be referred to for the details. Note that the first conductive film and the second conductive film are preferably formed using materials which can ensure etching selectivity. In this embodiment, a molybdenum nitride film is formed as the second conductive film and a titanium film is formed as the first conductive film, for example.

The insulating layers 243a and 243b are formed by etching with a mask formed over the insulating film. Wet etching or dry etching can be used in etching of the insulating film and wet etching and dry etching can be used in combination. The etching conditions (e.g., an etching gas, an etchant, etching time, and temperature) are set as appropriate depending on the material so that the insulating film can be etched into a desired shape. Note that dry etching is preferably used for reduction in a channel length (L) of a transistor. As an etching gas used in dry etching, for example, a gas containing fluorine such as sulfur hexafluoride ($SF_6$), nitrogen trifluoride ($NF_3$), trifluoromethane ($CHF_3$), or octafluorocyclobutane ($C_4F_8$), a mixed gas of tetrafluoromethane ($CF_4$) and hydrogen, or the like can be used. Furthermore, a rare gas (e.g., helium (He), argon (Ar), or xenon (Xe)), carbon monoxide, carbon dioxide, or the like may be added to the above gas.

Figure 4A:
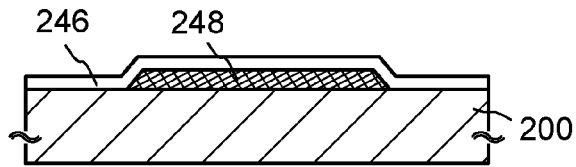
FIGS. 4A to 4F are cross-sectional views of manufacturing steps of a semiconductor device.
Figure 4B:
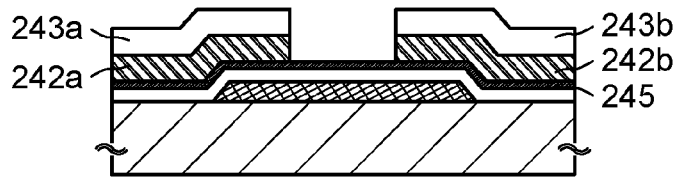

The first conductive film is etched with the use of a mask used for etching of the insulating film; thus, the first conductive layers 242a and 242b are formed (see FIG. 4B). When the first conductive film is etched, an etching material (an etchant or an etching gas) which ensures etching selectivity of the first conductive film with respect to the second conductive film is used. Alternatively, the mask may be removed before etching of the first conductive film and the first conductive film may be etched using the insulating layer 243a and the insulating layer 243b as masks.

The first conductive film can be etched by wet etching or dry etching. Alternatively, wet etching and dry etching may be used in combination. The etching conditions (e.g., an etching gas, an etchant, etching time, and temperature) are set as appropriate depending on the material so that the first conductive film can be etched into a desired shape. Note that dry etching is preferably used for reduction in a channel length (L) of a transistor. In this embodiment, a mixed gas of tetrafluoromethane ($CF_4$), chlorine ($Cl_2$), and oxygen ($O_2$), a mixed gas of tetrafluoromethane ($CF_4$) and oxygen ($O_2$), a mixed gas of sulfur hexafluoride ($SF_6$), chlorine ($Cl_2$), and oxygen ($O_2$), or a mixed gas of sulfur hexafluoride ($SF_6$) and oxygen ($O_2$) is used as an etching gas used for etching the first conductive film.

The insulating layer 243a and the insulating layer 243b are provided, whereby a region (e.g., a contact area) of contact between the source electrode or the drain electrode, and an oxide semiconductor layer to be formed later can be easily controlled. That is, resistance of the source electrode or the drain electrode can be easily controlled and a short-channel effect can be effectively suppressed.

Figure 4C:
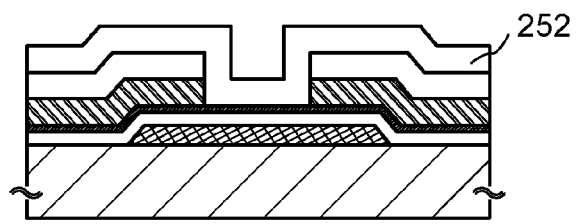

Next, an insulating film 252 is formed so as to cover the insulating layer 243a, the insulating layer 243b, and the exposed second conductive film 245 (see FIG. 4C). The insulating film 252 can be formed by a CVD method or a sputtering method. The insulating film 252 preferably contains silicon oxide, silicon nitride, silicon oxynitride, aluminum oxide, or the like. The insulating film 252 may have a single-layer structure or a stacked-layer structure.

Figure 4D:
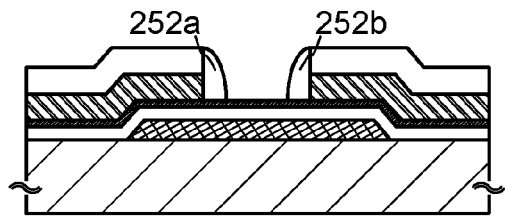

Next, the sidewall insulating layers 252a and 252b are formed in a region between the first conductive layer 242a and the first conductive layer 242b over the second conductive film 245 (see FIG. 4D). The sidewall insulating layers 252a and 252b can be formed in a self-aligned manner by performing highly anisotropic etching treatment on the insulating film 252. Here, dry etching is preferable as highly anisotropic etching. As an etching gas, a gas containing fluorine such as trifluoromethane ($CHF_3$) or octafluorocyclobutane ($C_4F_8$) can be used, for example. Alternatively, a rare gas such as helium (He) or argon (Ar) may be added to the above gas. Furthermore, it is preferable to employ a reactive ion etching (RIE) method in which high-frequency voltage is applied to a substrate as dry etching.

Figure 4E:
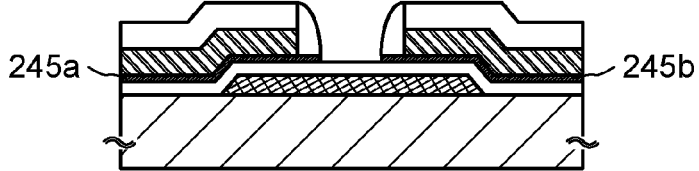

Next, the second conductive film 245 is selectively etched using the sidewall insulating layers 252a and 252b as masks to form the second conductive layers 245a and 245b (see FIG. 4E). In this etching step, the source electrode in which the second conductive layer 245a and the first conductive layer 242a are stacked and the drain electrode in which the second conductive layer 245b and the first conductive layer 242b are stacked are formed. Note that the second conductive film 245 can be etched in a manner similar to that described in Embodiment 1 except that the sidewall insulating layers 252a and 252b are used as masks.

The channel length (L) of the transistor 260 is determined in accordance with a distance between a lower end portion of the second conductive layer 245a and a lower end portion of the second conductive layer 245b. Although an appropriate channel length (L) differs depending on the usage of the transistor 260, the channel length (L) can be 10 nm to 1000 nm, preferably 20 nm to 400 nm, for example.

In the steps of manufacturing the transistor described in this embodiment, the second conductive film 245 is etched using the sidewall insulating layer 252a and the sidewall insulating layer 252b. Therefore, in the second conductive layer 245a, the length ($L_S$) of the region extending beyond the side surface of the first conductive layer 242a in a channel length direction is substantially equal to the length of a bottom surface of the sidewall insulating layer 252a in a channel length direction. Similarly, in the second conductive layer 245b, the length ($L_D$) of the region extending beyond the side surface of the first conductive layer 242b in a channel length direction is substantially equal to the length of a bottom surface of the sidewall insulating layer 252b in a channel length direction. Since the sidewall insulating layers 252a and 252b are formed in a self-aligned manner by the etching treatment on the insulating film 252, $L_S$ or $L_D$ is determined in accordance with the thickness of the insulating film 252. That is, the channel length (L) of the transistor 260 can be adjusted minutely by controlling the thickness of the insulating film 252. For example, the channel length (L) of the transistor 260 can be made smaller than the minimum processing dimension of a light-exposure apparatus used for light exposure in formation of a mask. Therefore, the thickness of the insulating film 252 may be determined in accordance with a desired channel length (L) of the transistor 260, resolution of a light-exposure apparatus used for processing the second conductive layers 245a and 245b, or the like.

Figure 4F:
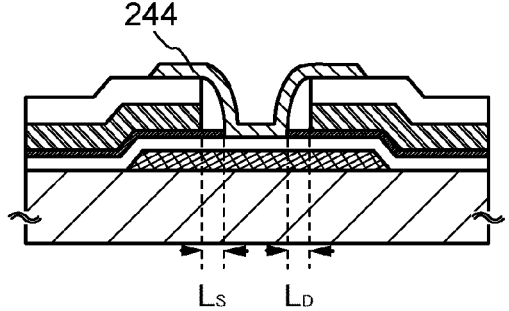

Next, the oxide semiconductor layer 244 is formed in contact with the second conductive layer 245a and the second conductive layer 245b so as to cover the insulating layers 243a and 243b and the sidewall insulating layers 252a and 252b (see FIG. 4F).

The oxide semiconductor layer 244 can be formed using the material and the method similar to those of the oxide semiconductor layer 144 described in Embodiment 1. Further, the oxide semiconductor layer 244 is desirably subjected to heat treatment (first heat treatment). Embodiment 1 can be referred to for the details. After the first heat treatment is performed, heat treatment (second heat treatment) is preferably performed in an inert gas atmosphere or an oxygen atmosphere. Embodiment 1 can be referred to for the details.

Note that in the source electrode of the transistor 260, a side surface of the region of the second conductive layer 245a, which extends beyond the side surface of the first conductive layer 242a in a channel length direction, is in contact with the oxide semiconductor layer 244. In the drain electrode, a side surface of the region of the second conductive layer 245b, which extends beyond the side surface of the first conductive layer 242b in a channel length direction, is in contact with the oxide semiconductor layer 244. Thus, the side surfaces of the second conductive layers 245a and 245b with smaller thickness than the thickness of the first conductive layers 242a and 242b are in contact with the oxide semiconductor layer 244, whereby a contact area between the source electrode and the oxide semiconductor layer 244 or between the drain electrode and the oxide semiconductor layer 244 can be reduced and resistance of the source electrode or the drain electrode can be increased in the vicinity of the oxide semiconductor layer 244. Accordingly, even when the channel length (L) of the transistor 260 is shortened, an electric field between the source electrode and the drain electrode can be relaxed and a short-channel effect can be suppressed. In addition, when the second conductive layer is formed using a material having higher resistance than the first conductive layer, resistance can be increased more effectively, which is preferable. Note that the technical idea of the disclosed invention is to form a high resistance region in a source electrode or a drain electrode; therefore, the source electrode or the drain electrode does not need to be exactly in contact with the oxide semiconductor layer 244 only at the side surfaces of the second conductive layer 245a or the second conductive layer 245b.

Thus, the transistor 260 including the oxide semiconductor layer 244 can be manufactured.

The channel length (L) of the transistor 260 described in this embodiment can be minutely controlled in accordance with the thickness of the insulating film 252 for forming the sidewall insulating layers 252a and 252b. Therefore, the channel length (L) of the transistor 260 can be shortened and miniaturization of a semiconductor device can be easily achieved by setting the thickness of the insulating film 252 as appropriate.

In the transistor 260 described in this embodiment, the sidewall insulating layer 252a is provided over the region of the second conductive layer 245a, which extends beyond the side surface of the first conductive layer 242a in a channel length direction, and the sidewall insulating layer 252b is provided over the region of the second conductive layer 245b, which extends beyond the side surface of the first conductive layer 242b in a channel length direction, whereby coverage with the oxide semiconductor layer 244 and the gate insulating layer 246 can be improved and thus defective film formation or the like can be prevented.

Further, in the transistor 260 described in this embodiment, the second conductive layer 245a has the region extending beyond the side surface of the first conductive layer 242a in a channel length direction and the second conductive layer 245b has the region extending beyond the side surface of the first conductive layer 242b in a channel length direction, so that the vicinity of the regions of the source electrode and the drain electrode, which are in contact with the channel formation region of the oxide semiconductor layer 244, is made to be a high resistance region; accordingly, an electric field between the source electrode and the drain electrode can be relaxed and a short-channel effect such as decrease in the threshold voltage can be suppressed.

Thus, in one embodiment of the disclosed invention, the problems with miniaturization can be solved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing cost per semiconductor device is reduced. Since the semiconductor device is miniaturized, a semiconductor device with a size similar to that of the conventional semiconductor device can have improved functions. Further, effects such as high speed operation, reduction in power consumption, and the like can be obtained because of reduction in channel length. That is, miniaturization of a transistor including an oxide semiconductor is achieved in accordance with one embodiment of the disclosed invention, and various effects accompanying therewith can also be obtained.

<Examples of Manufacturing Steps of Transistor 270 and Transistor 280>

Next, an example of manufacturing steps of the transistor 270 illustrated in FIG. 3B will be described. Here, details of each step are similar to the manufacturing steps of the transistor 260. Further, the transistor 280 illustrated in FIG. 3C is formed in a manner similar to the manufacturing steps of the transistor 270 except that the insulating layers 243a and 243b have regions with a curved-shape at least in part of regions in contact with the oxide semiconductor layer 244.

First, the conductive film is formed over the substrate 200, and then the conductive film is etched into the gate electrode 248. Next, the gate insulating layer 246 is formed so as to cover the gate electrode 248.

Next, the first conductive film is formed over the gate insulating layer 246, a mask is formed over the first conductive film, and the first conductive film is etched into the first conductive layers 242a and 242b.

Next, the second conductive film is formed over the first conductive layers 242a and 242b and the gate insulating layer 246, and the insulating film is formed over the second conductive film.

Next, a mask is formed over the insulating film, and the insulating film is etched using the mask to form the insulating layers 243a and 243b.

Here, the structure illustrated in FIG. 3B differs from the structure illustrated in FIG. 3A in that the first conductive layers 242a and 242b are formed and then the second conductive layers 245a and 245b are formed. When the second conducive film is formed and etched after formation of the first conductive layers 242a and 242b, etching selectivity of the first conductive film with respect to the second conductive film does not need to be secured, leading to wider selection of materials of the first conductive film and the second conductive film.

Next, the second conductive film is etched using the mask used for forming the insulating layers 243a and 243b to form the second conductive layers 245a and 245b. The insulating film and the second conductive film can be etched successively using the same etching gas. Alternatively, the mask is removed and then the second conductive film may be etched using the insulating layers 243a and 243b as masks.

Next, the oxide semiconductor film is formed over the insulating layers 243a and 243b and the gate insulating layer 246 by a sputtering method. Then, a mask is formed over the oxide semiconductor film and the oxide semiconductor film is etched using the mask to form the oxide semiconductor layer 244.

Thus, the transistor 270 including the oxide semiconductor layer 244 can be manufactured.

Note that when reverse sputtering with the use of an Ar gas is performed on the insulating layers 243a and 243b after formation of the second conductive layers 245a and 245b, the insulating layers 243a and 243b can have curved shapes at least in part of regions in contact with the oxide semiconductor layer 244 to be formed later. When the insulating layers 243a and 243b have curved shapes at least in part of the regions in contact with the oxide semiconductor layer 244, coverage with the oxide semiconductor layer 244 can be improved and disconnection can be prevented.

Thus, the transistor 280 illustrated in FIG. 3C can be manufactured.

The structures, methods, and the like described in this embodiment can be combined as appropriate with any of the structures, methods, and the like described in the other embodiments.

Embodiment 3

In this embodiment, a structure and a manufacturing process of a semiconductor device which are different from those of the semiconductor device described in the above embodiments will be described with reference to FIGS. 5A and 5B and FIGS. 6A to 6E.

<Example of Structure of Semiconductor Device>

Figure 5A:
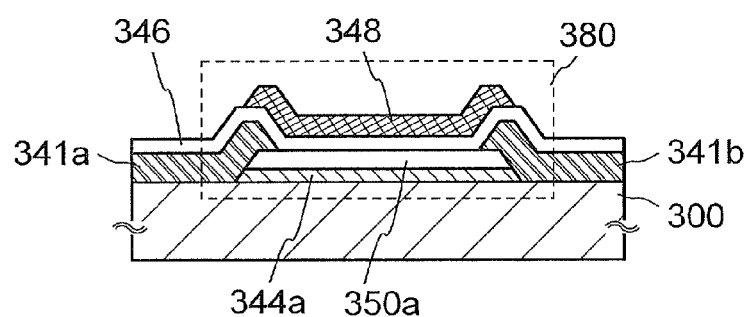
FIGS. 5A and 5B are each a cross-sectional view of a semiconductor device.
Figure 5B:
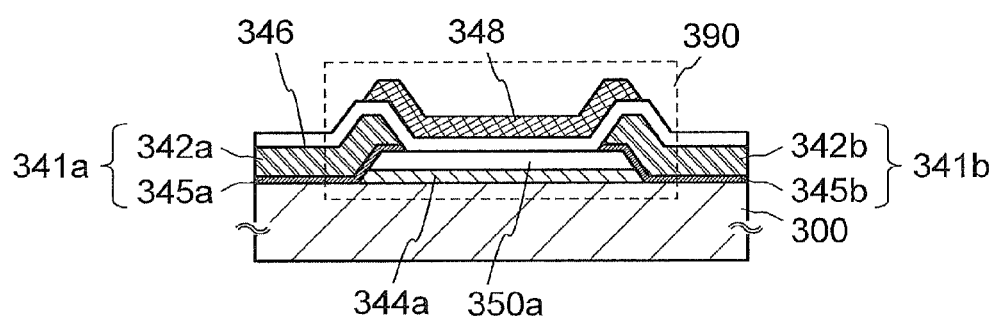

Each of FIGS. 5A and 5B illustrates a cross-sectional structure of a transistor as an example of a semiconductor device. In FIGS. 5A and 5B, top gate transistors are illustrated as the transistors of one embodiment of the disclosed invention.

A transistor 380 illustrated in FIG. 5A includes, over a substrate 300, an oxide semiconductor layer 344a, an insulating layer 350a provided on and in contact with the oxide semiconductor layer 344a, a source electrode 341a and a drain electrode 341b provided over the insulating layer 350a, a gate insulating layer 346 provided over the source electrode 341a and the drain electrode 341b, and a gate electrode 348 provided over the gate insulating layer 346.

In the transistor 380 illustrated in FIG. 5A, side surfaces of the oxide semiconductor layer 344a are in contact with the source electrode 341a and the drain electrode 341b. Further, upper ends of the side surfaces of the oxide semiconductor layer 344a align with lower ends of side surfaces of the insulating layer 350a and the oxide semiconductor layer 344a overlaps with the source electrode 341a and the drain electrode 341b with the insulating layer 350a over the oxide semiconductor layer 344a therebetween. That is, the oxide semiconductor layer 344a is in contact with the source electrode 341a and the drain electrode 341b only at the side surfaces.

Alternatively, as in a transistor 390 illustrated in FIG. 5B, a structure in which the source electrode 341a has a structure in which a second conductive layer 345a and a first conductive layer 342a are stacked in this order and the drain electrode 341b has a structure in which a second conductive layer 345b and a first conductive layer 342b are stacked in this order may be employed.

<Example of Manufacturing Steps of Transistor>

An example of steps of manufacturing the transistor illustrated in FIG. 5A will be described with reference to FIGS. 6A to 6E below.

Figure 6A:
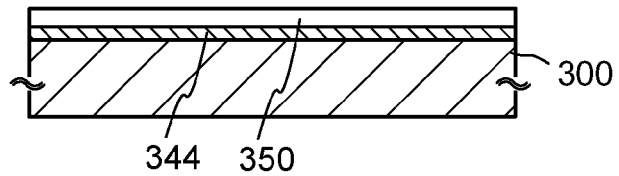
FIGS. 6A to 6E are cross-sectional views of manufacturing steps of a semiconductor device.

First, an oxide semiconductor layer 344 is formed over the substrate 300 having an insulating surface by a sputtering method and an insulating layer 350 is formed over the oxide semiconductor layer 344 (see FIG. 6A).

Here, a substrate similar to the substrate 100 described in Embodiment 1 can be used as the substrate 300. The oxide semiconductor layer 344 can be formed using a material and a film formation method similar to those of the oxide semiconductor layer 144 described in Embodiment 1. The insulating layer 350 can be formed using a material and a film formation method similar to those of the insulating layer 150 described in Embodiment 1. Embodiment 1 can be referred to for the details.

Figure 6B:
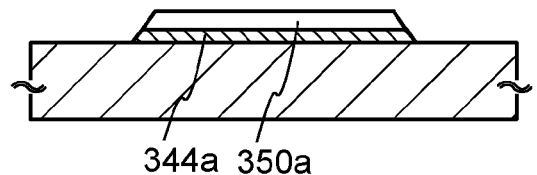

Next, the oxide semiconductor layer 344 and the insulating layer 350 are selectively etched by a method such as etching using a mask or the like to form the island-shaped oxide semiconductor layer 344a and the island-shaped insulating layer 350a (see FIG. 6B).

The oxide semiconductor layer 344a and the insulating layer 350a can be formed by a method similar to that for etching to form the oxide semiconductor layer 144a and the insulating layer 150a described in Embodiment 1. Embodiment 1 can be referred to for the details.

Figure 6C:
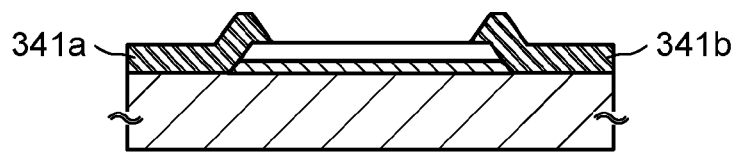

Next, over the substrate 300 and the insulating layer 350a, a conductive film is formed so as to be in contact with side surfaces of the oxide semiconductor layer 344a and then selectively etched into the source electrode 341a and the drain electrode 341b (see FIG. 6C).

The source electrode 341a and the drain electrode 341b can be formed using a material and a film formation method similar to those of the source electrode 141a and the drain electrode 141b described in Embodiment 1. Embodiment 1 can be referred to for the details.

Here, the distance between a side surface of the source electrode 341a and the side surface of the oxide semiconductor layer 344a on the source electrode 341a side in a channel length direction is preferably smaller than or equal to 0.1 µm. Similarly, the distance between a side surface of the drain electrode 341b and the side surface of the oxide semiconductor layer 344a on the drain electrode 341b side in a channel length direction is preferably smaller than or equal to 0.1 µm.

With such a structure, an electric field of the gate electrode 348 can be made to sufficiently act on the oxide semiconductor layer 344a.

Further, as described in Embodiment 1, when the conductive film to be the source electrode 341a and the drain electrode 341b has a structure in which a first conductive film and a second conductive film are sequentially stacked, the source electrode 341a may have a structure in which the second conductive layer 345a and the first conductive layer 342a are stacked in this order and the drain electrode 341b may have a structure in which the second conductive layer 345b and the first conductive layer 342b are stacked in this order as in a transistor 390 illustrated in FIG. 5B. The first conductive layers 342a and 342b and the second conductive layers 345a and 345b can be formed using materials and film deposition methods similar to those of the first conductive layers 142a and 142b and the second conductive layers 145a and 145b described in Embodiment 1. Therefore, Embodiment 1 can be referred to for the details.

Figure 6D:
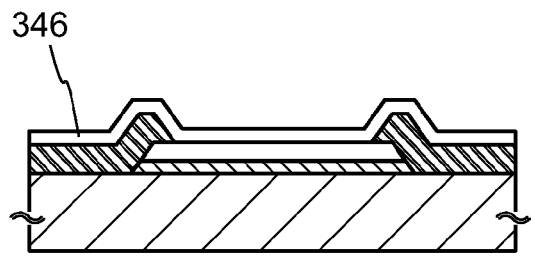

Next, the gate insulating layer 346 is formed so as to cover the insulating layer 350a, the source electrode 341a, and the drain electrode 341b (see FIG. 6D).

The gate insulating layer 346 can be formed using a material and a film formation method similar to those of the gate insulating layer 146 described in Embodiment 1. Therefore, Embodiment 1 can be referred to for the details.

Figure 6E:
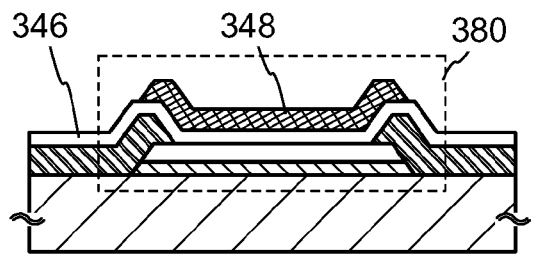

Next, a conductive film is formed over the gate insulating layer 346 and then selectively etched into the gate electrode 348 (see FIG. 6E). Here, the gate electrode 348 is formed in a region overlapping with the island-shaped oxide semiconductor layer 344a.

The gate electrode 348 can be formed using a material and a film formation method similar to those of the gate electrode 148 described in Embodiment 1. Therefore, Embodiment 1 can be referred to for the details.

Through the above steps, the transistor 380 including the oxide semiconductor layer 344a is completed.

Thus, the side surfaces of the oxide semiconductor layer 344a are in contact with the source electrode 341a and the drain electrode 341b, whereby a contact area between the source electrode 341a and the oxide semiconductor layer 344a and a contact area between the drain electrode 341b and the oxide semiconductor layer 344a can be reduced. Accordingly, contact resistance at the contact interface can be increased.

In the transistor 380 described in this embodiment, the oxide semiconductor layer 344a is in contact with the source electrode 341a and the drain electrode 341b only at the side surfaces, and contact resistance between the source electrode 341a and the oxide semiconductor layer 344a and contact resistance between the drain electrode 341b and the oxide semiconductor layer 344a are increased, whereby an electric field applied to the oxide semiconductor layer 344a can be relaxed and a short-channel effect such as decrease in the threshold voltage can be suppressed.

Thus, in one embodiment of the disclosed invention, the problems with miniaturization can be solved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing cost per semiconductor device is reduced. Since the semiconductor device is miniaturized, a semiconductor device with a size similar to that of the conventional semiconductor device can have improved functions. Further, effects such as high speed operation, reduction in power consumption, and the like can be obtained because of reduction in channel length. That is, miniaturization of a transistor including an oxide semiconductor is achieved in accordance with one embodiment of the disclosed invention, and various effects accompanying therewith can also be obtained.

The structures, methods, and the like described in this embodiment can be combined as appropriate with any of the structures, methods, and the like described in the other embodiments.

Embodiment 4

In this embodiment, a structure and a manufacturing process of a semiconductor device according to one embodiment of the disclosed invention, which are different from the above embodiments, will be described with reference to FIG. 7 and FIGS. 8A to 8D.

<Example of Structure of Semiconductor Device>

Figure 7:
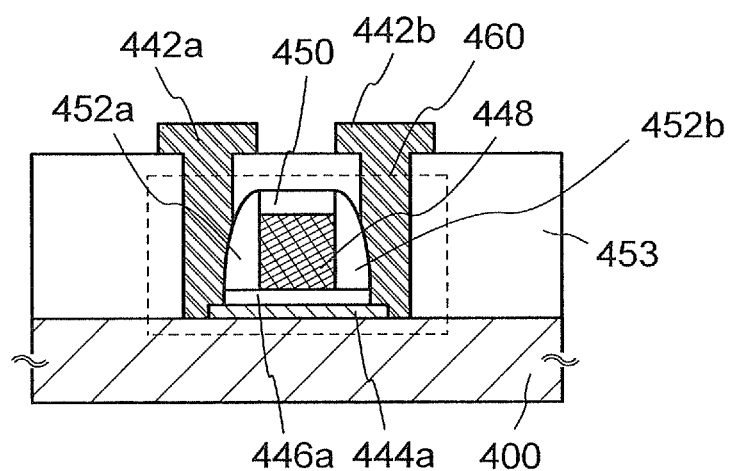
FIG. 7 is a cross-sectional view of a semiconductor device.

A transistor 460 illustrated in FIG. 7 is an example of a structure of a semiconductor device. The transistor 460 includes an oxide semiconductor layer 444a provided over a substrate 400, a gate insulating layer 446a provided over the oxide semiconductor layer 444a, a gate electrode 448 provided over the gate insulating layer 446a, and a source electrode 442a and a drain electrode 442b provided in contact with the oxide semiconductor layer 444a. Further, an interlayer insulating layer 453 is provided so as to cover the transistor 460.

In the transistor 460 illustrated in FIG. 7, an insulating layer 450 is provided in contact with an upper surface of the gate electrode 448. In addition, sidewall insulating layers 452a and 452b are provided in contact with side faces of the gate electrode 448.

In the transistor 460 illustrated in FIG. 7, the oxide semiconductor layer 444a may be formed so that the length of the oxide semiconductor layer 444a (length in a direction for carrier flow in a channel formation region) is longer than the length of the gate insulating layer 446a or so that the length of the oxide semiconductor layer 444a is substantially equal to the length of the gate insulating layer 446a.

<Example of Manufacturing Steps of Semiconductor Device>

Next, an example of manufacturing steps of the transistor 460 illustrated in FIG. 7 will be described. Details of the steps are the same as those of the other embodiments.

First, an oxide semiconductor film 444, an insulating film 446, a conductive film, and an insulating film are formed over the substrate 400 in this order. Then, a mask is formed over the topmost insulating film and the conductive film and the topmost insulating film are selectively etched using the mask to form the gate electrode 448 and the insulating layer 450 (see FIG. 8A). The above embodiments can be referred to for the details. Note that the insulating film 446 and the insulating layer 450 are preferably formed using materials having etching selectivity.

Next, an insulating layer is formed so as to cover at least the gate electrode 448 and the insulating layer 450. The insulating layer is subjected to highly anisotropic etching treatment to form the sidewall insulating layers 452a and 452b (see FIG. 8B). Note that the sidewall insulating layers 452a and 452b are preferably formed using a material having etching selectivity with respect to a material of the insulating film 446. The above embodiments can be referred to for the details.

Figure 8A:
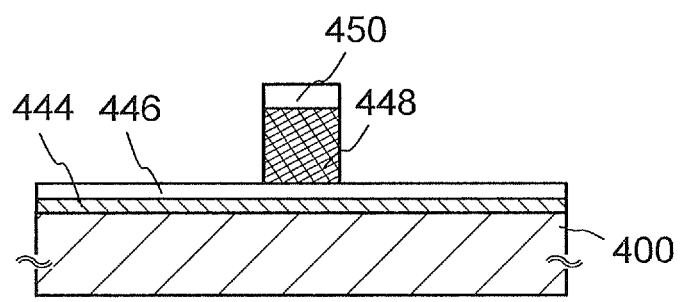
FIGS. 8A to 8D are cross-sectional views of manufacturing steps of a semiconductor device.
Figure 8B:
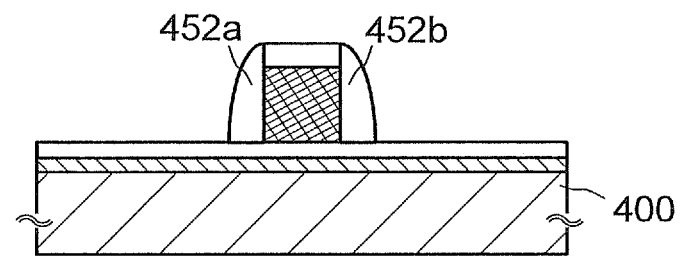
Figure 8C:
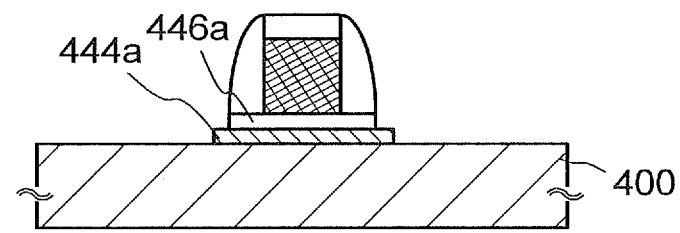
Figure 8D:
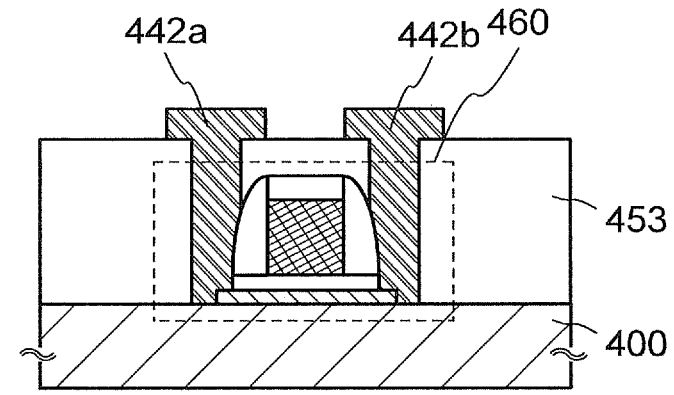

Next, the oxide semiconductor film 444 and the insulating film 446 are selectively etched using the insulating layer 450 and the sidewall insulating layers 452a and 452b as masks to form the oxide semiconductor layer 444a and the gate insulating layer 446a (see FIG. 8C). Here, the insulating film 446 and the oxide semiconductor film 444 may be collectively etched at once, or the insulating film 446 and the oxide semiconductor film 444 may be individually etched. Note that the sidewall insulating layers 452a and 452b may be recessed depending on conditions of the etching treatment. In that case, the source electrode 442a and the drain electrode 442b to be formed later are in contact with part of an upper surface of the oxide semiconductor layer 444a. The above embodiments can be referred to for the details.

Next, the interlayer insulating layer 453 is formed over the substrate 400 so as to cover the oxide semiconductor layer 444a, the gate insulating layer 446a, the insulating layer 450, the sidewall insulating layers 452a and 452b, and the like. Then, openings reaching the oxide semiconductor layer 444a are formed in the interlayer insulating layer 453, and then the source electrode 442a and the drain electrode 442b which are connected to the oxide semiconductor layer 444a are formed (see FIG. 8D). Note that the interlayer insulating layer 453 is preferably formed to have a flat surface by a CMP treatment or the like. When the interlayer insulating layer 453 has a flat surface, the source electrode 442a and the drain electrode 442b to be formed later are favorably formed. Note that here, the openings are formed in the interlayer insulating layer 453 and then the source electrode 442a and the drain electrode 442b are formed; however, the source electrode 442a and the drain electrode 442b may be formed before the interlayer insulating layer 453 is formed. The above embodiments can be referred to for the details of the interlayer insulating layer, the source electrode, the drain electrode, and the like.

Through the above steps, the transistor 460 including the oxide semiconductor layer 444a can be manufactured.

With such a structure described in this embodiment, a region (e.g., a contact area) of contact between source electrode or the drain electrode, and the oxide semiconductor layer can be easily controlled. That is, resistance of the source electrode or the drain electrode can be easily controlled and a short-channel effect can be effectively suppressed.

Thus, in one embodiment of the disclosed invention, the problems with miniaturization can be solved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing cost per semiconductor device is reduced. Since the semiconductor device is miniaturized, a semiconductor device with a size similar to that of the conventional semiconductor device can have improved functions. Further, effects such as high speed operation, reduction in power consumption, and the like can be obtained because of reduction in channel length. That is, miniaturization of a transistor including an oxide semiconductor is achieved in accordance with one embodiment of the disclosed invention, and various effects accompanying therewith can also be obtained.

The structures, methods, and the like described in this embodiment can be combined as appropriate with any of the structures, methods, and the like described in the other embodiments.

Embodiment 5

In this embodiment, application examples of a semiconductor device according to one embodiment of the disclosed invention will be described with reference to FIGS. 9A1, 9A2, and 9B. Here, an example of a memory device will be described. Note that in a circuit diagram, "OS" is written beside a transistor in order to indicate that the transistor includes an oxide semiconductor.

In the semiconductor device illustrated in FIG. 9A1, a first wiring (a 1st Line) is electrically connected to a source electrode of a transistor 500, and a second wiring (a 2nd Line) is electrically connected to a drain electrode of the transistor 500. A third wiring (a 3rd Line) is electrically connected to one of a source electrode and a drain electrode of a transistor 510, and a fourth wiring (a 4th Line) is electrically connected to a gate electrode of the transistor 510. A gate electrode of the transistor 500 and the other of the source electrode and the drain electrode of the transistor 510 are electrically connected to one of electrodes of the capacitor 520, and a fifth wiring (a 5th Line) is electrically connected to the other of the electrodes of the capacitor 520.

Here, a transistor including the above oxide semiconductor is used as the transistor 510. A transistor including an oxide semiconductor has a characteristic of significantly small off-state current. For that reason, a potential of the gate electrode of the transistor 500 can be retained for an extremely long time by turning off the transistor 510. Provision of the capacitor 520 facilitates holding of charge given to the gate electrode of the transistor 500 and reading of stored data.

Note that there is no particular limitation on the transistor 500. In terms of increasing the speed of reading data, it is preferable to use, for example, a transistor with high switching rate such as a transistor including single crystal silicon.

Alternatively, a structure in which the capacitor 520 is not provided can be employed as illustrated in FIG. 9B.

The semiconductor device illustrated in FIG. 9A1 utilizes a characteristic in which the potential of the gate electrode of the transistor 500 can be held, thereby writing, storing, and reading data as follows.

First, writing and storing of data will be described. First, a potential of the fourth wiring is set to a potential at which the transistor 510 is turned on, so that the transistor 510 is turned on. Accordingly, a potential of the third wiring is supplied to the gate electrode of the transistor 500 and the capacitor 520. That is, predetermined charge is given to the gate electrode of the transistor 500 (writing). Here, one of charges for supply of two different potentials (hereinafter, a charge for supply of a low potential is referred to as a charge $Q_L$ and a charge for supply of a high potential is referred to as a charge $Q_H$) is given to the gate electrode of the transistor 500. Note that charges giving three or more different potentials may be applied to improve a storage capacitor. After that, the potential of the fourth wiring is set to a potential at which the transistor 510 is turned off, so that the transistor 510 is turned off. Thus, the charge given to the gate electrode of the transistor 500 is held (holding).

Since the off-state current of the transistor 510 is significantly small, the charge of the gate electrode of the transistor 500 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 500. This is because in general, when the transistor 500 is an n-channel transistor, an apparent threshold voltage $V_{th\_H}$ in the case where $Q_H$ is given to the gate electrode of the transistor 500 is lower than an apparent threshold voltage $V_{th\_L}$ in the case where $Q_L$ is given to the gate electrode of the transistor 500. Here, an apparent threshold voltage refers to the potential of the fifth wiring, which is needed to turn on the transistor 500. Thus, the potential of the fifth wiring is set to a potential $V_0$ intermediate between $V_{th\_H}$ and $V_{th\_L}$, whereby charge given to the gate electrode of the transistor 500 can be determined. For example, in the case where $Q_H$ is given in writing, when the potential of the fifth wiring is set to $V_0$ ($>V_{th\_H}$), the transistor 500 is turned on. In the case where $Q_L$ is given in writing, even when the potential of the fifth wiring is set to $V_0$ ($<V_{th\_L}$), the transistor 500 remains in an off state. Therefore, the stored data can be read by the potential of the second wiring.

Note that in the case where memory cells are arrayed to be used, only data of desired memory cells is needed to be read. Thus, in order that data of a predetermined memory cell is read and data of the other memory cells is not read, in the case where the transistors 500 are connected in parallel between the memory cells, a potential which allows the transistor 500 to be turned off regardless of a state of the gate electrode, that is, a potential lower than $V_{th\_H}$ may be given to fifth lines of the memory cells whose data is not to be read. In the case where the transistors 500 are connected in series between memory cells, a potential which allows the transistor 500 to be turned on regardless of the state of the gate electrode, that is, potential higher than $V_{th\_L}$ may be given to the fifth lines.

Next, rewriting of data will be described. Rewriting of data is performed in a manner similar to that of the writing and storing of data. That is, the potential of the fourth wiring is set to a potential at which the transistor 510 is turned on, so that the transistor 510 is turned on. Accordingly, the potential of the third wiring (potential related to new data) is given to the gate electrode of the transistor 500 and the capacitor 520. After that, the potential of the fourth wiring is set to a potential at which the transistor 510 is turned off, whereby the transistor 510 is turned off. Accordingly, the charge related to new data is given to the gate electrode of the transistor 500.

In the semiconductor device according to the disclosed invention, data can be directly rewritten by another writing of data as described above. Therefore, extracting of charge from a floating gate with the use of high voltage needed in a flash memory or the like is not necessary and thus, reduction in operation speed, which is attributed to erasing operation, can be suppressed. In other words, high-speed operation of the semiconductor device can be realized.

Note that the source electrode or the drain electrode of the transistor 510 is electrically connected to the gate electrode of the transistor 500, thereby having an effect similar to that of a floating gate of a floating gate transistor used for a nonvolatile memory element. Therefore, a portion in the drawing where the source electrode or the drain electrode of the transistor 510 is electrically connected to the gate electrode of the transistor 500 is called a floating gate portion FG in some cases. When the transistor 510 is off, the floating gate portion FG can be regarded as being embedded in an insulator and thus charge is held in the floating gate portion FG. The amount of off-state current of the transistor 510 including an oxide semiconductor is smaller than or equal to one hundred thousandth of the amount of off-state current of a transistor including a silicon semiconductor or the like; thus, lost of the charge accumulated in the floating gate portion FG due to leakage current of the transistor 510 is negligible. That is, with the transistor 510 including an oxide semiconductor, a nonvolatile memory device which can store data even when power is not supplied can be realized.

For example, when the off-state current of the transistor 510 is 10 zA (1 zA (zeptoampere) is $1 \times 10^{-21}$ A) or less at room temperature and the capacitance value of the capacitor 520 is approximately 10 fF, data can be stored for $10^4$ seconds or longer. It is needless to say that the storage time depends on transistor characteristics and the capacitance value.

Further, in that case, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limit on the number of times of writing in principle. Furthermore, high voltage needed for writing or erasing in a conventional floating gate transistor is not necessary.

The components such as transistors in the semiconductor device illustrated in FIG. 9A1 can be regarded as including a resistor and a capacitor as shown in FIG. 9A2. That is, in FIG. 9A2, the transistor 500 and the capacitor 520 are each regarded as including a resistor and a capacitor. R1 and C1 denote the resistance value and the capacitance value of the capacitor 520, respectively. The resistance value R1 corresponds to the resistance value which depends on an insulating layer included in the capacitor 520. R2 and C2 denote the resistance value and the capacitance value of the transistor 500, respectively. The resistance value R2 corresponds to the resistance value which depends on a gate insulating layer at the time when the transistor 500 is on. The capacitance value C2 corresponds to the capacitance value of so-called gate capacitance (capacitance formed between the gate electrode and each of the source electrode and the drain electrode and capacitance formed between the gate electrode and the channel formation region).

When the resistance value (also referred to as effective resistance) between the source electrode and the drain electrode in the case where the transistor 510 is in an off state is ROS, a charge holding period (also referred to as a data storing period) is determined mainly by off-state current of the transistor 510 under the conditions that gate leakage of the transistor 510 is sufficiently small and that ROS is R1 or smaller and ROS is R2 or smaller.

On the other hand, when the conditions are not met, it is difficult to sufficiently secure the holding period even if the off-state current of the transistor 510 is small enough. This is because a leakage current other than the off-state current of the transistor 510 (e.g., a leakage current generated between the source electrode and the gate electrode) is large. Thus, it can be said that the semiconductor device disclosed in this embodiment desirably satisfies the above relation.

It is desirable that C1 be larger than or equal to C2. When C1 is larger, the potential of the fifth wiring can be efficiently applied to the floating gate portion FG in controlling a potential of the floating gate portion FG by the fifth wiring; thus, a potential difference between potentials applied to the fifth wiring (e.g., a reading potential and a non-reading potential) can be suppressed.

When the above relation is satisfied, a more preferable semiconductor device can be realized. Note that R1 and R2 are controlled by the gate insulating layer of the transistor 500 and the insulating layer of the capacitor 520. This is also applied to C1 and C2. Therefore, the material, the thickness, and the like of the gate insulating layer are desirably set as appropriate to satisfy the above relation.

In the semiconductor device described in this embodiment, the floating gate portion FG has an effect similar to a floating gate of a floating gate transistor of a flash memory or the like, but the floating gate portion FG of this embodiment has a feature which is essentially different from that of the floating gate of the flash memory or the like. In the case of a flash memory, since voltage applied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which a tunneling current flows in applying a high electrical field.

Further, because of the above principle of a flash memory, deterioration of an insulating film proceeds and thus another problem of the limit on the number of times of rewriting (approximately $10^4$ to $10^5$ times) occurs.

The semiconductor device according to the disclosed invention is operated by switching of a transistor including an oxide semiconductor and does not use the above-described principle of charge injection by a tunneling current. That is, a high electrical field for charge injection is not necessary unlike a flash memory. Accordingly, it is not necessary to consider an influence of a high electrical field from a control gate on an adjacent cell, which facilitates high integration.

Further, since principle of charge injection by a tunneling current is not employed, there is no cause for deterioration of a memory cell. In other words, the semiconductor device according to the disclosed invention has higher durability and reliability than a flash memory.

In addition, it is also advantageous that a high electrical field is unnecessary and a large peripheral circuit (such as a booster circuit) is unnecessary as compared to a flash memory.

In the case where the dielectric constant $\in r1$ of the insulating layer included in the capacitor 520 is different from the dielectric constant $\in r2$ of the insulating layer forming a gate capacitor of the transistor 500, it is easy to satisfy that C1 is greater than or equal to C2 while the relation 2·S2 is greater than or equal to S1 (desirably, S2 is greater than or equal to S1) where S1 is the area of the insulating layer included in the capacitor 520 and S2 is the area of the insulating layer forming the gate capacitor of the transistor 500. Specifically, for example, a film formed of a high dielectric constant (high-k) material such as hafnium oxide or a stack of a film formed of a high dielectric constant (high-k) material such as hafnium oxide and a film formed of an oxide semiconductor is used for the insulating layer included in the capacitor 520 so that $\in r1$ can be set to 10 or more, preferably 15 or more, and silicon oxide is used for the insulating layer forming the gate capacitor of the transistor 500 so that $\in r2$ can be set to 3 or 4.

Combination of such structures enables higher integration of the semiconductor device according to the disclosed invention.

Note that an n-channel transistor in which electrons are majority carriers is used in the above description; it is needless to say that a p-channel transistor in which holes are majority carriers can be used instead of the n-channel transistor.

As described above, a semiconductor device according to one embodiment of the disclosed invention has a nonvolatile memory cell including a writing transistor where a leakage current (off-state current) between a source and a drain is small in an off state, a reading transistor formed of a semiconductor material different from that of the writing transistor, and a capacitor.

The off-state current of the writing transistor is 100 zA ($1 \times 10^{-19}$ A) or less, preferably 10 zA ($1 \times 10^{-20}$ A) or less, more preferably 1 zA ($1 \times 10^{-21}$ A) or less at ambient temperature (e.g., 25° C.). In the case of general silicon semiconductor, it is difficult to achieve small off-state current as described above. However, in a transistor obtained by processing an oxide semiconductor under an appropriate condition, small off-state current can be achieved. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, rising of a writing pulse given to the floating gate portion FG can be very sharp. Further, off-state current is small and thus, the amount of charge held in the floating gate portion FG can be reduced. That is, by using a transistor including an oxide semiconductor as the writing transistor, rewriting of data can be performed at high speed.

As for the reading transistor, although there is no limitation on off-state current, it is preferable to use a transistor which operates at high speed in order to increase the reading rate. For example, a transistor with a switching rate of 1 nanosecond or lower is preferably used as the reading transistor.

Data is written to the memory cell by turning on the writing transistor so that a potential is supplied to the floating gate portion FG where one of a source electrode and a drain electrode of the writing transistor, one of electrodes of the capacitor, and a gate electrode of the reading transistor are electrically connected, and then turning off the writing transistor so that the predetermined amount of charge is held in the floating gate portion FG. Here, the off-state current of the writing transistor is very small; thus, the charge supplied to the floating gate portion FG is held for a long time. When an off-state current is, for example, substantially 0, refresh operation needed for a conventional DRAM can be unnecessary or the frequency of refresh operation can be significantly low (for example, about once a month or a year). Accordingly, power consumption of a semiconductor device can be reduced sufficiently.

Further, data can be rewritten directly by overwriting of new data to the memory cell. Erasing operation, necessary in a flash memory and the like, is thus not needed; therefore, reduction in operation speed due to erasing operation can be suppressed. In other words, high-speed operation of the semiconductor device can be realized. Moreover, a high voltage necessary for a conventional floating gate transistor to write and erase data is unnecessary; thus, power consumption of the semiconductor device can be further reduced. The highest voltage applied to the memory cell according to this embodiment (the difference between the highest potential and the lowest potential applied to respective terminals of the memory cell at the same time) can be 5 V or lower, preferably 3 V or lower, in each memory cell in the case where data of two stages (one bit) is written.

The memory cell provided in the semiconductor device according to the disclosed invention may include at least the writing transistor, the reading transistor, and the capacitor. Further, the memory cell can operate even when the area of the capacitor is small. Accordingly, the area of each memory cell can be sufficiently small as compared to an SRAM which requires six transistors in each memory cell, for example; thus, the memory cells can be arranged in a semiconductor device at high density.

In a conventional floating gate transistor, charge travels in a gate insulating film (tunnel insulating film) during writing operation, so that deterioration of the gate insulating film (tunnel insulating film) cannot be avoided. In contrast, in the memory cell according to one embodiment of the present invention, data is written by switching operation of a writing transistor; therefore, the deterioration of a gate insulating film, which has been traditionally recognized as a problem, can be avoided. This means that there is no limit on the number of times of writing in principle and writing durability is very high. For example, in the memory cell according to one embodiment of the present invention, the current-voltage characteristic is not degraded even after data is written $1 \times 10^9$ or more times (one billion or more times).

Further, in the case of using a transistor including an oxide semiconductor as the writing transistor of the memory cell, the current-voltage characteristic of the memory cell is not degraded even at, for example, a high temperature of 150° C. because an oxide semiconductor generally has a wide energy gap (e.g., 3.0 to 3.5 eV in the case of an In—Ga—Zn—O-based oxide semiconductor) and extremely few thermally excited carriers.

As a result of intensive research, the present inventors have succeeded in finding for the first time that a transistor including an oxide semiconductor has excellent characteristics in that the characteristics do not deteriorate even at a high temperature of 150° C. and off-state current is smaller than or equal to 100 zA, which is extremely small. According to one embodiment of the disclosed invention, a semiconductor device having a novel feature by using a transistor having such excellent characteristics as the writing transistor of the memory cell is provided.

According to one embodiment of the disclosed invention, in a transistor including an oxide semiconductor, defects are prevented, favorable characteristics are maintained, and miniaturization can be achieved. With the use of such a transistor, the excellent memory device as described above can be highly integrated.

The structures, methods, and the like described in this embodiment can be combined as appropriate with any of the structures, methods, and the like described in the other embodiments.

Embodiment 6

In this embodiment, application examples of a semiconductor device according to one embodiment of the disclosed invention will be described with reference to FIGS. 10A and 10B and FIGS. 11A to 11C.

Figure 10A:
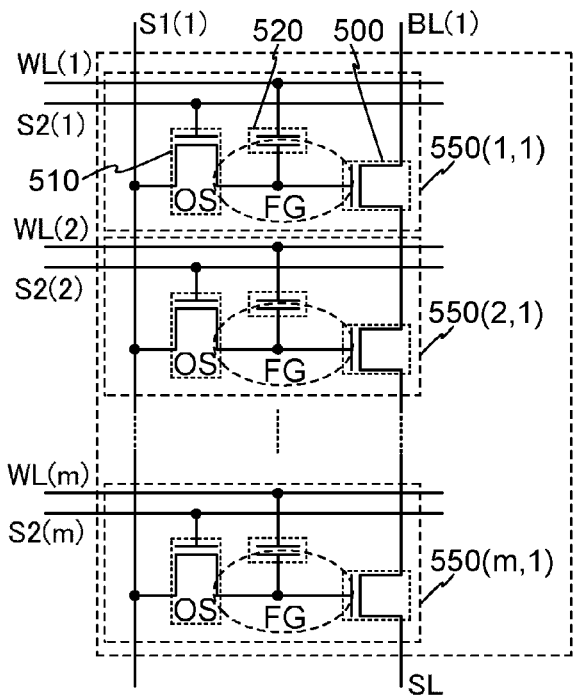
FIGS. 10A and 10B are each an example of a circuit diagram of a semiconductor device.
Figure 10B:
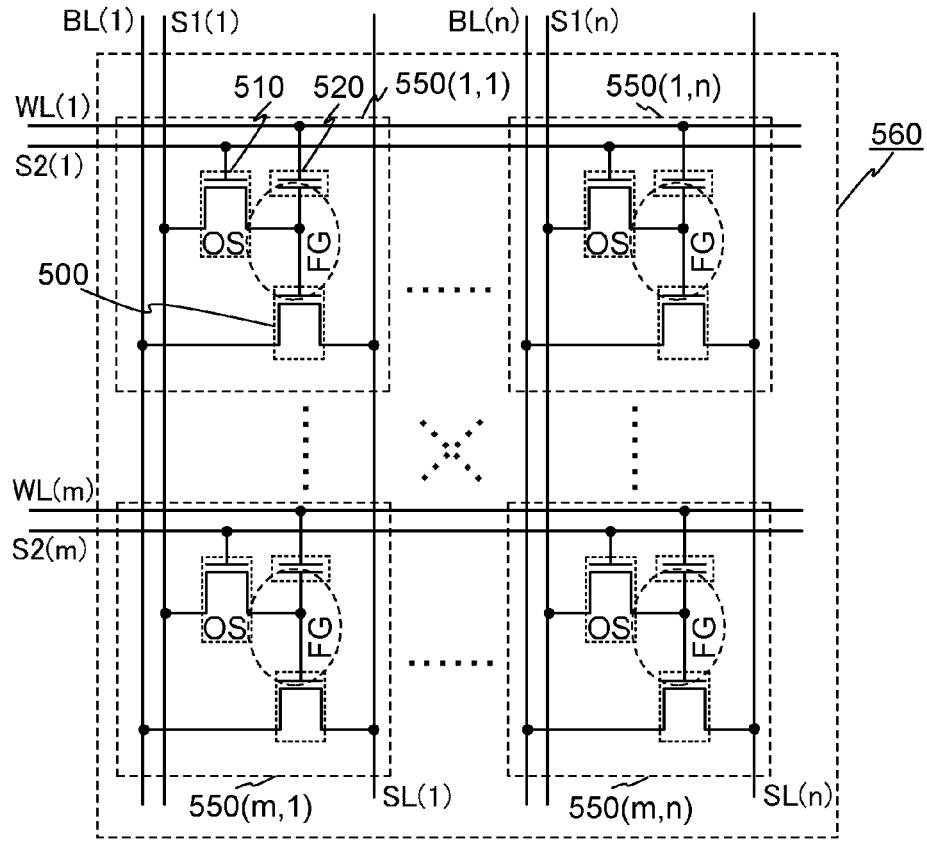

FIGS. 10A and 10B are circuit diagrams of semiconductor devices each including a plurality of semiconductor devices (hereinafter also referred to as memory cells 550) illustrated in FIG. 9A1. FIG. 10A is a circuit diagram of a so-called NAND semiconductor device in which the memory cells 550 are connected in series, and FIG. 10B is a circuit diagram of a so-called NOR semiconductor device in which the memory cells 550 are connected in parallel.

The semiconductor device in FIG. 10A includes a source line SL, a bit line BL, a first signal line S1, m second signal lines S2, m word lines WL, and a plurality of memory cells 550(1, 1) to 550(m, 1) which is arranged in a matrix of m (rows) (in a vertical direction)×1 (a column) (in a horizontal direction). Note that in FIG. 10A, one source line SL and one bit line BL are provided in the semiconductor device; however, one embodiment of the disclosed invention is not limited to this. The semiconductor device may include n source lines SL and n bit lines BL so that a memory cell array where the memory cells are arranged in a matrix of m (rows) (in a vertical direction)×n (columns) (in a horizontal direction) is formed.

In each of the memory cells 550, a gate electrode of the transistor 500, one of a source electrode and a drain electrode of the transistor 510, and one of electrodes of the capacitor 520 are electrically connected to each another. The first signal line S1 and the other of the source electrode and the drain electrode of the transistor 510 are electrically connected to each other, and the second signal line S2 and a gate electrode of the transistor 510 are electrically connected to each other. The word line WL and the other of the electrodes of the capacitor 520 are electrically connected to each other.

Further, the source electrode of the transistor 500 included in the memory cell 550 is electrically connected to the drain electrode of the transistor 500 in the adjacent memory cell 550. The drain electrode of the transistor 500 included in the memory cell 550 is electrically connected to the source electrode of the transistor 500 in the adjacent memory cell 550. Note that the drain electrode of the transistor 500 included in the memory cell 550 of the plurality of memory cells connected in series, which is provided at one of ends, is electrically connected to the bit line. In addition, the source electrode of the transistor 500 included in the memory cell 550 of the plurality of memory cells connected in series, which is provided at the other end, is electrically connected to the source line.

In the semiconductor device in FIG. 10A, writing operation and reading operation are performed in each row. The writing operation is performed as follows. A potential at which the transistor 510 is turned on is supplied to the second signal line S2 in a row where writing is performed, so that the transistor 510 in the row where writing is performed is turned on. Accordingly, a potential of the first signal line S1 is supplied to the gate electrode of the transistor 500 of the specified row, so that predetermined charge is given to the gate electrode. Thus, data can be written to the memory cell of the specified row.

Further, the reading operation is performed as follows. First, a potential at which the transistor 500 is turned on regardless of charge given to the gate electrode of the transistor 500 is supplied to the word lines WL of the rows other than the row where reading is to be performed, so that the transistors 500 of the rows other than the row where reading is to be performed are turned on. Then, a potential (reading potential) at which an on state or an off state of the transistor 500 is determined depending on charge in the gate electrode of the transistor 500 is supplied to the word line WL of the row where reading is to be performed. After that, a constant potential is supplied to the source line SL so that a reading circuit (not illustrated) connected to the bit line BL is operated. Here, the plurality of transistors 500 between the source line SL and the bit line BL are on except the transistors 500 of the row where reading is to be performed; therefore, conductance between the source line SL and the bit line BL is determined by a state (an on state or an off state) of the transistors 500 of the row where reading is to be performed. The conductance of the transistors 500 on which reading is performed depends on charge in the gate electrodes of the transistors 500. Thus, a potential of the bit line BL varies accordingly. By reading the potential of the bit line BL with the reading circuit, data can be read from the memory cells of the specified row.

The semiconductor device illustrated in FIG. 10B includes n source lines SL, n bit lines BL, n first signal lines S1, m second signal lines S2, m word lines WL, and a memory cell array 560 including the plurality of memory cells 550(1, 1) to 550(m, n) which is arranged in a matrix of m (rows) (in a vertical direction)×n (columns) (in a horizontal direction). A gate electrode of the transistor 500, one of the source electrode and the drain electrode of the transistor 510, and one of electrodes of the capacitor 520 are electrically connected to one another. The source line SL and a source electrode of the transistor 500 are electrically connected to each other. The bit line BL and a drain electrode of the transistor 500 are electrically connected to each other. The first signal line S1 and the other of the source electrode and the drain electrode of the transistor 510 are electrically connected to each other, and the second signal line S2 and a gate electrode of the transistor 510 are electrically connected to each other. The word line WL and the other of the electrodes of the capacitor 520 are electrically connected to each other.

In the semiconductor device in FIG. 10B, writing operation and reading operation are performed in each row. The writing operation is performed in a manner similar to that in the semiconductor device illustrated in FIG. 10A. The reading operation is performed as follows. First, a potential at which the transistor 500 is turned off regardless of charge given to the gate electrode of the transistor 500 is supplied to the word lines WL of the rows other than the row where reading is to be performed, so that the transistors 500 of the rows other than the row where reading is to be performed are turned off. Then, a potential (reading potential) at which an on state or an off state of the transistor 500 is determined depending on charge in the gate electrode of the transistor 500 is given to the word line WL of the row where reading is to be performed. After that, a constant potential is supplied to the source line SL so that a reading circuit (not illustrated) connected to the bit line BL is operated. Here, conductance between the source lines SL and the bit lines BL is determined by a state (an on state or an off state) of the transistors 500 of the row where reading is to be performed. That is, a potential of the bit line BL, depends on charge in the gate electrode of the transistor 500 of the row where reading is to be performed. By reading the potential of the bit line BL with the reading circuit, data can be read from the memory cells of the specified row.

Although the amount of data which can be stored in each of the memory cells 550 is one bit in the above description, the structure of the memory device of this embodiment is not limited to this. The amount of data which is stored in each of the memory cells 550 may be increased by preparing three or more potentials to be supplied to the gate electrode of the transistor 500. For example, in the case where the number of potentials to be supplied to the gate electrode of the transistor 500 is four, data of two bits can be stored in each of the memory cells.

Next, examples of reading circuits which can be used for the semiconductor devices in FIGS. 10A and 10B or the like will be described with reference to FIGS. 11A to 11C.

Figure 11A:
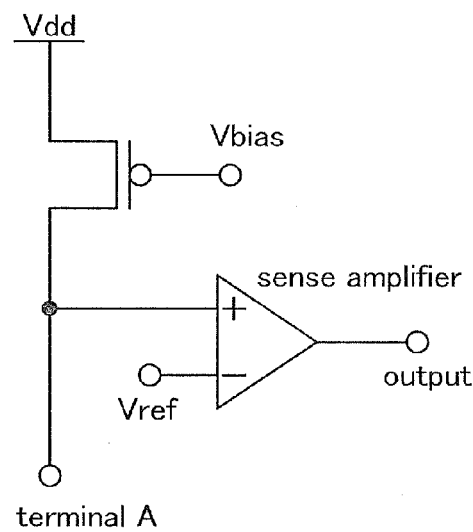
FIGS. 11A to 11C are each an example of a circuit diagram of a semiconductor device.

FIG. 11A illustrates an outline of a reading circuit. The reading circuit includes a transistor and a sense amplifier circuit.

At the time of reading of data, a terminal A is connected to a bit line to which a memory cell from which data is read is connected. Further, a bias potential Vbias is applied to a gate electrode of the transistor so that a potential of the terminal A is controlled.

The resistance of the memory cell 550 varies depending on stored data. Specifically, when the transistor 500 in a selected memory cell 550 is on, the memory cell 550 has a low resistance, whereas when the transistor 500 in a selected memory cell 550 is off, the memory cell 550 has a high resistance.

When the memory cell 550 has high resistance, a potential of the terminal A is higher than a reference potential Vref and the sense amplifier circuit outputs a potential corresponding to the potential of the terminal A. On the other hand, when the memory cell 550 has low resistance, the potential of the terminal A is lower than the reference potential Vref and the sense amplifier circuit outputs a potential corresponding to the potential of the terminal A.

Thus, by using the reading circuit, data can be read from the memory cell 550. Note that the reading circuit of this embodiment is one of examples. Alternatively, another known circuit may be used. The reading circuit may include a precharge circuit. Instead of the reference potential Vref, a reference bit line may be connected to the sense amplifier circuit.

Figure 11B:
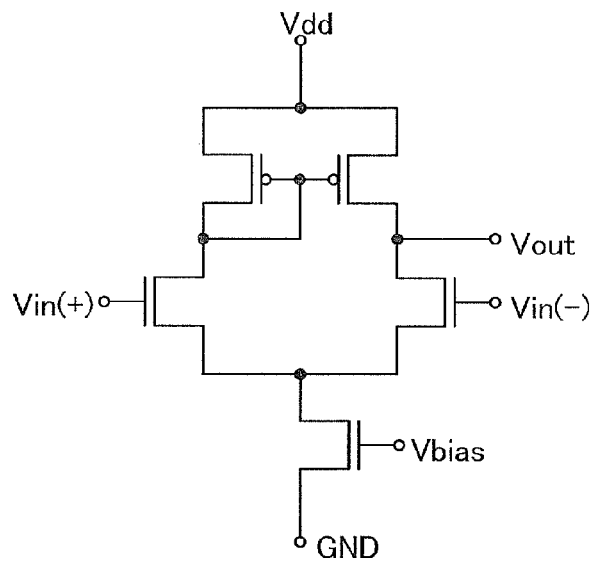

FIG. 11B illustrates a differential sense amplifier which is an example of sense amplifier circuits. The differential sense amplifier has an input terminal Vin(+), an input terminal Vin(−), and an output terminal Vout, and amplifies the difference between Vin(+) and Vin(−). When Vin(+)>Vin(−), output of Vout is approximately high, whereas when Vin(+)<Vin(−), the output of the Vout is approximately low. In the case where the differential sense amplifier is used for the reading circuit, one of Vin (+) and Vin(−) is connected to the input terminal A, and the reference potential Vref is supplied to the other of Vin(+) and Vin(−).

Figure 11C:
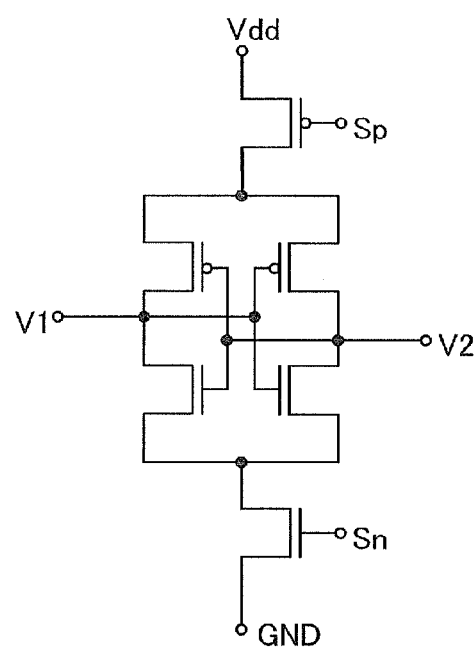

FIG. 11C illustrates a latch sense amplifier which is an example of sense amplifier circuits. The latch sense amplifier has input/output terminals V1 and V2 and input terminals for control signals Sp and Sn. First, the control signals Sp and Sn are set to High and Low, respectively, and a power supply potential (Vdd) is interrupted. Then, potentials to be compared are applied to V1 and V2. After that, the control signals Sp and Sn are set to Low and High, respectively, and a power supply potential (Vdd) is supplied. If the potentials V1in and V2in to be compared satisfy V1in>V2in, output of the V1 is High and output of the V2 is Low, whereas if the potentials satisfy V1in<V2in, the output of V1 is Low and the output of V2 is High. By utilizing such a relation, the difference between V1in and V2in can be amplified. In the case where the latch sense amplifier is used for the reading circuit, one of V1 and V2 is connected to the terminal A and the output terminal through a switch, and the reference potential Vref is supplied to the other of V1 and V2.

The structures, methods, and the like described in this embodiment can be combined as appropriate with any of the structures, methods, and the like described in the other embodiments.

Embodiment 7

In this embodiment, the case where the semiconductor device described in the above embodiments is applied to electronic devices is described with reference to FIGS. 12A to 12F. The case where the above described semiconductor device is applied to electronic devices such as a computer, a mobile phone (also referred to as a mobile telephone or a mobile phone device), a personal digital assistant (including a portable game machine, an audio reproducing device, and the like), a digital camera, a digital video camera, electronic paper, a television set (also referred to as a television or a television receiver) and the like will be described.

Figure 12A:
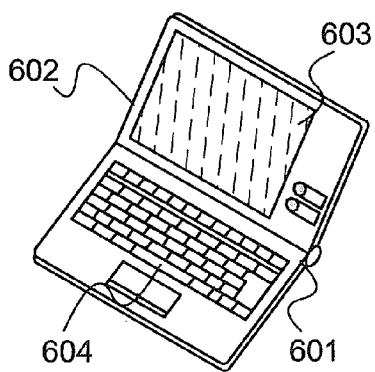
FIGS. 12A to 12F are each an example of an electronic device.

FIG. 12A illustrates a notebook personal computer which includes a housing 601, a housing 602, a display portion 603, a keyboard 604, and the like. In each of the housings 601 and 602, the miniaturized semiconductor device described in any of the above embodiments is provided. Therefore, a notebook personal computer having characteristics of being small, high-speed operation, and low power consumption can be realized.

Figure 12D:
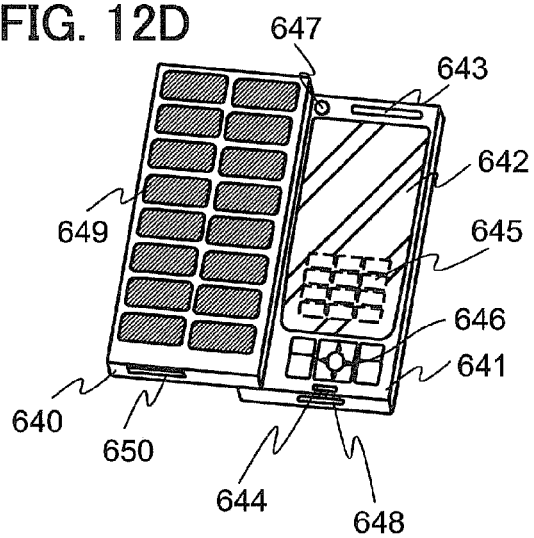
Figure 12B:
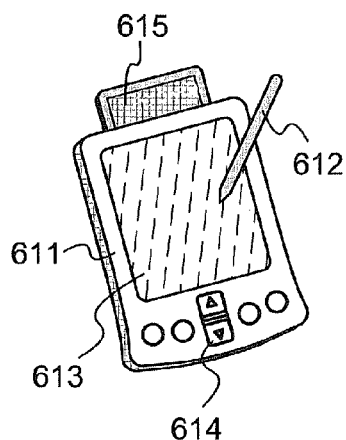

FIG. 12B illustrates a personal digital assistant (PDA) which includes a main body 611 provided with a display portion 613, an external interface 615, operation buttons 614, and the like. In addition, a stylus 612 which controls the personal digital assistant and the like are provided. In the main body 611, the miniaturized semiconductor device described in any of the above embodiments is provided. Therefore, a personal digital assistant having characteristics of being small, high-speed operation, and low power consumption can be realized.

Figure 12E:
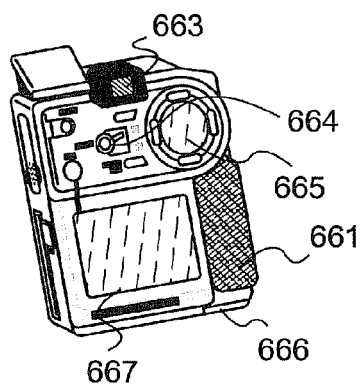
Figure 12C:
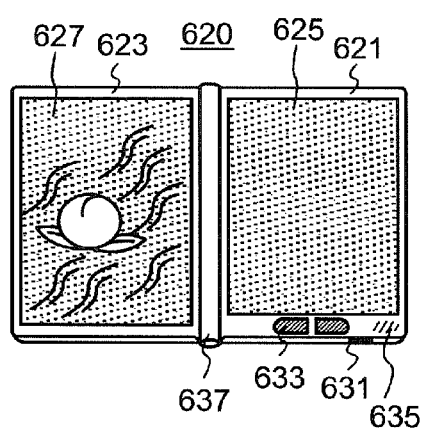

FIG. 12C illustrates an e-book reader 620 which is mounted with electronic paper and includes two housings of a housing 621 and a housing 623. The housing 621 and the housing 623 are respectively provided with a display portion 625 and a display portion 627. The housing 621 is combined with the housing 623 by a hinge 637, so that the e-book reader 620 can be opened and closed using the hinge 637 as an axis. The housing 621 is provided with a power button 631, operation keys 633, a speaker 635, and the like. In at least one of the housing 621 and the housing 623, the miniaturized semiconductor device described in any of the above embodiments is provided. Therefore, an e-book reader having characteristics of being small, high-speed operation, and low power consumption can be realized.

FIG. 12D illustrates a mobile phone which includes two housings of a housing 640 and a housing 641. Moreover, the housings 640 and 641 in a state where they are developed as illustrated in FIG. 12D can be slid so that one is lapped over the other. Therefore, the size of the mobile phone can be reduced, which makes the mobile phone suitable for being carried around. The housing 641 includes a display panel 642, a speaker 643, a microphone 644, a pointing device 646, a camera lens 647, an external connection terminal 648, and the like. The housing 640 includes a solar cell 649 for charging the mobile phone, an external memory slot 650, and the like. The display panel 642 has a function as a touch panel. A plurality of operation keys 645 which is displayed as images is illustrated by dashed lines in FIG. 12D. In addition, an antenna is incorporated in the housing 641. In at least one of the housings 640 and 641, the miniaturized semiconductor device described in any of the above embodiments is provided. Therefore, a mobile phone having characteristics of being small, high-speed operation, and low power consumption can be realized.

FIG. 12E illustrates a digital camera which includes a main body 661, a display portion 667, an eyepiece 663, an operation switch 664, a display portion 665, a battery 666, and the like. In the main body 661, the miniaturized semiconductor device described in any of the above embodiments is provided. Therefore, a digital camera having characteristics of being small, high-speed operation, and low power consumption can be realized.

Figure 12F:
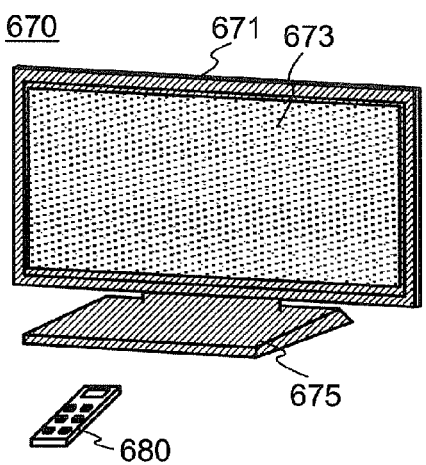

FIG. 12F illustrates a television device 670 which includes a housing 671, a display portion 673, a stand 675, and the like. The television device 670 can be operated with an operation switch of the housing 671 or a remote controller 680. The miniaturized semiconductor device described in any of the above embodiments is mounted on the housing 671 and the remote controller 680. Therefore, a television device having characteristics of high-speed operation and low power consumption can be realized.

As described above, a semiconductor device according to the above embodiments is mounted on the electronic devices shown in this embodiment. Therefore, an electronic device having characteristics of being small, high-speed operation, and low power consumption can be realized.

This application is based on Japanese Patent Application serial no. 2010-024636 filed with Japan Patent Office on Feb. 5, 2010, the entire contents of which are hereby incorporated by reference.

EXPLANATION OF REFERENCE

100: substrate, 141a: source electrode, 141b: drain electrode, 142a: first conductive layer, 142b: first conductive layer, 144: oxide semiconductor layer, 144a: oxide semiconductor layer, 145a: second conductive layer, 145b: second conductive layer, 146: gate insulating layer, 148: gate electrode, 150: insulating layer, 150a: insulating layer, 180: transistor, 190: transistor, 200: substrate, 242a: first conductive layer, 242b: first conductive layer, 243a: insulating layer, 243b: insulating layer, 244: oxide semiconductor layer, 245: conductive film, 245a: second conductive layer, 245b: second conductive layer, 246: gate insulating layer, 248: gate electrode, 252: insulating film, 252a: sidewall insulating layer, 252b: sidewall insulating layer, 260: transistor, 270: transistor, 280: transistor, 300: substrate, 344: oxide semiconductor layer, 346: gate insulating layer, 348: gate electrode, 350: insulating layer, 380: transistor, 390: transistor, 341a: source electrode, 341b: drain electrode, 342a: first conductive layer, 342b: first conductive layer, 344a: oxide semiconductor layer, 345a: second conductive layer, 345b: second conductive layer, 350a: insulating layer, 400: substrate, 444: oxide semiconductor film, 446: insulating film, 448: gate electrode, 450: insulating layer, 453: interlayer insulating layer, 460: transistor, 442a: source electrode, 442b: drain electrode, 444a: oxide semiconductor layer, 446a: gate insulating layer, 452a: sidewall insulating layer, 452b: sidewall insulating layer, 500: transistor, 510: transistor, 520: capacitor, 550: memory cell, 560: memory cell array, 601: housing, 602: housing, 603: display portion, 604: keyboard, 611: main body, 612: stylus, 613: display portion, 614: operation button, 615: external interface, 620: e-book reader, 621: housing, 623: housing, 625: display portion, 627: display portion, 631: power button, 633: operation key, 635: speaker, 637: hinge, 640: housing, 641: housing, 642: display panel, 643: speaker, 644: microphone, 645: operation key, 646: pointing device, 647: camera lens, 648: external connection terminal, 649: solar cell, 650: external memory slot, 661: main body, 663: eyepiece, 664: operation switch, 665: display portion, 666: battery, 667: display portion, 670: television device, 671: housing, 673: display portion, 675: stand, and 680: remote controller.

The invention claimed is:

1. A semiconductor device comprising:
an oxide semiconductor layer on and in direct contact with an insulating surface;
an insulating layer over the oxide semiconductor layer and in direct contact with the insulating surface, the insulating layer comprising an opening formed from a top surface to a bottom surface of the insulating layer;
an electrode in electrical contact with the oxide semiconductor layer in the opening;
a gate electrode overlapping with the oxide semiconductor layer;
a sidewall insulating layer covering a side surface of the gate electrode, the sidewall insulating layer being formed from a first layer and the insulating layer being formed from a second layer distinct from the first layer; and
a gate insulating layer between the oxide semiconductor layer and the gate electrode,
wherein the electrode is in direct contact with the sidewall insulating layer, and
wherein the electrode is in direct contact with and covers a top region of the insulating surface.

2. The semiconductor device according to claim 1, wherein the gate electrode is provided over the oxide semiconductor layer.

3. The semiconductor device according to claim 1, wherein the oxide semiconductor layer is provided over the gate electrode.

4. The semiconductor device according to claim 1, wherein the oxide semiconductor layer comprises indium and zinc.

5. The semiconductor device according to claim 1,
wherein the electrode comprises a first conductive layer and a second conductive layer having higher resistance than the first conductive layer, and
wherein the second conductive layer is in direct contact with the oxide semiconductor layer.

6. The semiconductor device according to claim 5, wherein a thickness of the second conductive layer is greater than or equal to 5 nm and less than or equal to 15 nm.

7. The semiconductor device according to claim 5, wherein the second conductive layer comprises a nitride of a metal.

8. The semiconductor device according to claim 1,
wherein the gate electrode is over the oxide semiconductor layer, and
wherein the insulating layer covers the gate electrode.

9. A semiconductor device comprising:
an oxide semiconductor layer on and in direct contact with an insulating surface;
an insulating layer over the oxide semiconductor layer and in direct contact with the insulating surface, the insulating layer comprising a first opening and a second opening each formed from a top surface to a bottom surface of the insulating layer;
a first electrode and a second electrode each in electrical contact with the oxide semiconductor layer, and totally filling the first opening and the second opening, respectively;
a gate electrode overlapping with the oxide semiconductor layer;
sidewall insulating layers covering two side surfaces of the gate electrode, the sidewall insulating layers being formed from a first layer and the insulating layer being formed from a second layer distinct from the first layer; and
a gate insulating layer between the oxide semiconductor layer and the gate electrode,
wherein the first electrode and the second electrode are each in direct contact with one of the sidewall insulating layers, and
wherein the first electrode and the second electrode are in direct contact with and cover a top region of the insulating surface.

10. The semiconductor device according to claim 9, wherein the gate electrode is provided over the oxide semiconductor layer.

11. The semiconductor device according to claim 9, wherein the oxide semiconductor layer is provided over the gate electrode.

12. The semiconductor device according to claim 9, wherein the oxide semiconductor layer comprises indium and zinc.

13. The semiconductor device according to claim 9,
wherein the first electrode comprises a first conductive layer and a second conductive layer having higher resistance than the first conductive layer, and
wherein the second conductive layer is in direct contact with the oxide semiconductor layer.

14. The semiconductor device according to claim 13, wherein a thickness of the second conductive layer is greater than or equal to 5 nm and less than or equal to 15 nm.

15. The semiconductor device according to claim 13, wherein the second conductive layer comprises a nitride of a metal.

16. The semiconductor device according to claim 9,
wherein the gate electrode is over the oxide semiconductor layer, and
wherein the insulating layer covers the gate electrode.

17. The semiconductor device according to claim 9,
wherein, when seen in a cross-section taken along a length direction of a channel formation region of the oxide semiconductor layer, a distance separating the two openings is shorter than a distance separating the two side surfaces of the gate insulating layer.

18. A semiconductor device comprising:
an oxide semiconductor layer on and in direct contact with an insulating surface;
an insulating layer with a flat top surface over the oxide semiconductor layer and in direct contact with the insulating surface, the insulating layer comprising a first opening and a second opening each formed from the flat top surface to a bottom surface of the insulating layer;
a first electrode and a second electrode each in direct contact with the oxide semiconductor layer, and totally filling the first opening and the second opening, respectively;
a gate electrode overlapping with the oxide semiconductor layer;
a first sidewall insulating layer and second sidewall insulating layer each covering one of two side surfaces of the gate electrode, the first and the second sidewall insulating layers being formed from a first layer and the insulating layer being formed from a second layer distinct from the first layer; and
a gate insulating layer between the oxide semiconductor layer and the gate electrode,
wherein the first electrode and the second electrode are each in direct contact with one of the sidewall insulating layers, and
wherein the first electrode and the second electrode are in direct contact with and cover a top region of the insulating surface.

19. The semiconductor device according to claim 18,
wherein the gate electrode is over the oxide semiconductor layer, and
wherein the insulating layer covers the gate electrode.

20. The semiconductor device according to claim 18,
wherein, when seen in a cross-section taken along a length direction of a channel formation region of the oxide semiconductor layer, a distance separating the two openings is shorter than a distance separating two exterior side surfaces of the two sidewall insulating layers.

21. A semiconductor device comprising:
an oxide semiconductor layer on and in direct contact with an insulating surface;
an insulating layer over the oxide semiconductor layer and in direct contact with the insulating surface, the insulating layer comprising an opening formed from a top surface to a bottom surface of the insulating layer;
an electrode in electrical contact with the oxide semiconductor layer in the opening;
a gate electrode overlapping with the oxide semiconductor layer;
a sidewall insulating layer covering a side surface of the gate electrode, the sidewall insulating layer being formed from a first layer and the insulating layer being formed from a second layer distinct from the first layer; and
a gate insulating layer between the oxide semiconductor layer and the gate electrode,
wherein the electrode is in direct contact with the sidewall insulating layer.

22. A semiconductor device comprising:
an insulating surface;
an oxide semiconductor layer on the insulating surface;

first and second conductive layers on and in electrical contact with first and second portions of the oxide semiconductor layer, respectively;

a third conductive layer overlapping a third portion of the oxide semiconductor layer, the third portion being between the first and the second portions;

a first insulating layer covering a side surface of the third conductive layer and interposed between the third conductive layer and the first conductive layer;

an interlayer on the insulating surface and in direct contact with side edges of the first and the second conductive layers, wherein the first insulating layer is interposed between the interlayer and the side surface of the third conductive layer, and wherein the interlayer is not interposed between a portion of the first conductive layer and a bottom portion of the third conductive layer.

23. The semiconductor device according to claim 22,
wherein the first insulating layer overlaps a space separating the first and the third portions of the oxide semiconductor layers.

24. The semiconductor device according to claim 22, further comprising a second insulating layer between the oxide semiconductor layer and the third conductive layer,
wherein the first insulating layer and the second insulating layer are distinct from each other.

25. The semiconductor device according to claim 22,
wherein a cross section of the semiconductor device taken along a line going from the first conductive layer to the second conductive layer shows that the first conductive layer is interposed between a bottom portion of the first insulating layer and the interlayer and not interposed between a top portion of the first insulating layer and the interlayer.

26. A semiconductor device comprising:
an insulating surface;
an oxide semiconductor layer on the insulating surface;
first and second conductive layers on and in electrical contact with first and second portions of the oxide semiconductor layer, respectively;
a third conductive layer overlapping a third portion of the oxide semiconductor layer, the third portion being between the first and the second portions;
a first insulating layer covering a side surface of the third conductive layer and interposed between the third conductive layer and the first conductive layer;
an interlayer on the insulating surface and in direct contact with side edges of the first and the second conductive layers,
wherein the first insulating layer is interposed between the interlayer and the side surface of the third conductive layer, and
wherein the first insulating layer is in direct contact with the first conductive layer.

27. The semiconductor device according to claim 26,
wherein the first insulating layer overlaps a space separating the first and the third portions of the oxide semiconductor layers.

28. The semiconductor device according to claim 26, further comprising a second insulating layer between the oxide semiconductor layer and the third conductive layer,
wherein the first insulating layer and the second insulating layer are distinct from each other.

29. The semiconductor device according to claim 26,
wherein a cross section of the semiconductor device taken along a line going from the first conductive layer to the second conductive layer shows that the first conductive layer is interposed between a bottom portion of the first insulating layer and the interlayer and not interposed between a top portion of the first insulating layer and the interlayer.

* * * * *